United States Patent
Reiskarimian et al.

(10) Patent No.: US 10,581,135 B2
(45) Date of Patent: Mar. 3, 2020

(54) CIRCUITS AND METHODS FOR NON-RECIPROCAL CIRCULATORS AND TRANSCEIVERS USING SAME

(71) Applicants: Negar Reiskarimian, New York, NY (US); Harish Krishnaswamy, New York, NY (US)

(72) Inventors: Negar Reiskarimian, New York, NY (US); Harish Krishnaswamy, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 15/774,410

(22) PCT Filed: Dec. 7, 2016

(86) PCT No.: PCT/US2016/065456
§ 371 (c)(1),
(2) Date: May 8, 2018

(87) PCT Pub. No.: WO2017/139012
PCT Pub. Date: Aug. 17, 2017

(65) Prior Publication Data
US 2018/0331408 A1 Nov. 15, 2018

Related U.S. Application Data

(60) Provisional application No. 62/346,977, filed on Jun. 7, 2016, provisional application No. 62/271,297, filed
(Continued)

(51) Int. Cl.
*H01P 1/397* (2006.01)
*H01P 5/22* (2006.01)
(Continued)

(52) U.S. Cl.
CPC .............. *H01P 1/397* (2013.01); *G02F 1/011* (2013.01); *H01P 5/222* (2013.01); *H03H 7/00* (2013.01);
(Continued)

(58) Field of Classification Search
CPC .......... H01P 1/397; H01P 5/222; G02F 1/011; H03H 7/00; H03H 7/52; H03H 11/16;
(Continued)

(56) References Cited

U.S. PATENT DOCUMENTS 3,304,519 A    2/1967   Weiss
4,061,905 A   12/1977   Fettweis
(Continued)

FOREIGN PATENT DOCUMENTS

WO    WO 2017/139012     8/2017

OTHER PUBLICATIONS

Sharma, A., "90-degree phase lumped-element shifter", Microwaves101.com, Mar. 2016, pp. 1-5. (Year: 2016).*
(Continued)

*Primary Examiner* — Benny T Lee
*Assistant Examiner* — Hafizur Rahman
(74) *Attorney, Agent, or Firm* — Byrne Poh LLP

(57) ABSTRACT

In accordance with some embodiments, non-reciprocal circulators are provided, the circulators comprising: a 3λX/4-long ring section having a first end and a second end, wherein λ is an operating wavelength of the non-reciprocal circulator; and a N-path filter having a first port, a second port, and N-paths, each of the N-paths being connected to the first port and the second port. In some of these embodiments, the 3λ/4-long ring section includes a transmit port, an antenna port, and a receive port. In some of these embodiments, the transmit port is λ/4 away from the antenna port. In some of these embodiments, the antenna port is λ/4 away from the receive port. In some of these embodiments, the receive port is at the first port of the N-path filter.

16 Claims, 14 Drawing Sheets

Related U.S. Application Data on Dec. 27, 2015, provisional application No. 62/264,312, filed on Dec. 7, 2015.

(51) Int. Cl.

| | |
|---|---|
| *H04B 3/40* | (2006.01) |
| *H03H 7/00* | (2006.01) |
| *H03H 7/52* | (2006.01) |
| *G02F 1/01* | (2006.01) |
| *H03H 11/16* | (2006.01) |
| *H04B 1/44* | (2006.01) |
| *H04B 1/525* | (2015.01) |
| *H04L 5/16* | (2006.01) |

(52) U.S. Cl.
CPC ............. *H03H 7/52* (2013.01); *H03H 11/16* (2013.01); *H04B 1/44* (2013.01); *H04B 1/525* (2013.01); *H04B 3/40* (2013.01); *H04L 5/16* (2013.01)

(58) Field of Classification Search
CPC .. H04B 1/44; H04B 1/525; H04B 3/40; H04L 5/16
USPC ...................................................... 333/1, 1.1
See application file for complete search history.

(56) References Cited

U.S. PATENT DOCUMENTS

| | | |
|---|---|---|
| 4,079,377 A | 3/1978 | Zur Heiden et al. |
| 4,641,365 A | 2/1987 | Montini, Jr. |
| 5,608,361 A | 3/1997 | Weiss et al. |
| 6,141,571 A | 10/2000 | Dionne |
| 7,113,760 B1 | 9/2006 | Petrov et al. |
| 7,599,675 B2 | 10/2009 | Mu et al. |
| 7,778,611 B2 | 8/2010 | Asai et al. |
| 8,155,602 B2 | 4/2012 | Ziaei et al. |
| 8,576,752 B2 | 11/2013 | Sarca |
| 8,829,973 B2 | 9/2014 | Sander |
| 8,868,006 B2 | 10/2014 | Cox et al. |
| 9,054,406 B2 | 6/2015 | Ueda et al. |
| 9,197,170 B2 | 11/2015 | Corman et al. |
| 9,203,455 B2 | 12/2015 | Yang et al. |
| 9,319,210 B2 | 4/2016 | Choi et al. |
| 9,325,432 B2 | 4/2016 | Hong et al. |
| 9,337,885 B2 | 5/2016 | Mehlman et al. |
| 10,044,321 B2 | 8/2018 | Bhagavatula et al. |
| 2005/0248478 A1 | 11/2005 | Ling |
| 2009/0051464 A1 | 2/2009 | Atsumo |
| 2009/0247074 A1 | 10/2009 | Cox et al. |
| 2009/0262784 A1 | 10/2009 | Ikeda |
| 2010/0109791 A1 | 5/2010 | Lingel |
| 2013/0241669 A1 | 9/2013 | Mikhemar et al. |
| 2013/0343235 A1 | 12/2013 | Khan |
| 2014/0341581 A1 | 11/2014 | Lent et al. |
| 2015/0016309 A1 | 1/2015 | Fang et al. |
| 2015/0030280 A1 | 1/2015 | Alu et al. |
| 2015/0188646 A1 | 7/2015 | Bharadia et al. |
| 2015/0207537 A1 | 7/2015 | Cox et al. |
| 2016/0087823 A1 | 3/2016 | Wang |
| 2016/0112226 A1 | 4/2016 | Martinez et al. |

OTHER PUBLICATIONS

Kalialakis et al., Analysis and Design of Integrated Active Circulator Antennas, IEEE Transactions on Microwave Theory and Techniques, vol. 48, No. 6, Jun. 2000, pp. 1017-1023. (Year: 2000).*

Nova microwave application note titled, "Understanding Circulators and Isolators", published in 2014 pp. 1-6. (Year: 2014).*

D.M. Pozar, Microwave Engineering, 4th Edition, John Wiley & Sons, pp. 72-75. (Year: 2012).*

Abdelhalem et al., "Tunable CMOS Integrated Duplexer with Antenna Impedance Tracking and High Isolation in the Transmit and Receive Bands", in IEEE Transactions on Microwave Theory and Techniques, vol. 62, issue 9, Sep. 2014, pp. 2092-2104.

Adam et al., "Ferrite Devices and Materials", in IEEE Transactions on Microwave Theory and Technology, vol. 50, issue 3, Mar. 2002, pp. 721-737.

Adam et al., "Monolithic Integration of an X-Band Circulator with GaAs MMICs", in the Proceedings of the IEEE International Microwave Symposium, Orlando, FL, US, May 16-20, 1995, pp. 97-98.

Andrews et al., "Implications of Passive Mixer Transparency for Impedance Matching and Noise Figure in Passive Mixer-First Receivers", in IEEE Transactions on Circuits and Systems, vol. 57, issue 12, Dec. 2010, pp. 3092-3103.

Ayati et al., "Adaptive Integrated CMOS Circulator", in the Proceedings of the IEEE Radio Frequency Integrated Circuits Symposium, San Francisco, CA, US, May 22-24, 2016, pp. 146-149.

Bharadia et al., "Full Duplex Radios", in ACM SIGCOMM Computer Communication Review, vol. 43, No. 4, Oct. 2013, pp. 375-386.

Bi et al., "On-Chip Optical Isolation in Monolithically Integrated Non-Reciprocal Optical Resonators", in Nature Photonics, issue 5, Jun. 15, 2011, pp. 758-762.

Busignies et al., "Some Relations Between Speed of Indication, Bandwidth, Signal-to-Random-Noise Ratio in Radio Navigation and Direction Finding", in the Proceedings of the IRE, vol. 37, No. 5, May 1949, pp. 478-488.

Carchon et al., "Power and Noise Limitations of Active Circulators", in IEEE Transaction on Microwave Theory and Techniques, vol. 48, issue 2, Feb. 2000, pp. 316-319.

Choi et al., "Achieving Single Channel, Full Duplex Wireless Communication", in the Proceedings of MobiCom, Chicago, IL, US, Sep. 2010, pp. 1-12.

Dinc et al., "A 60GHz Same-Channel Full-Duplex CMOS Transceiver and Link Based on Reconfigurable Polarization-Based Antenna Cancellation", in the Proceedings of the IEEE Radio Frequency Integrated Circuits Symposium, Phoenix, AZ, US, May 2015, pp. 1-4.

Dinc et al., "A T/R Antenna Pair with Polarization-Based Reconfigurable Wideband Self-Interference Cancellation for Simultaneous Transmit and Receive", in the Proceedings of the IEEE International Microwave Symposium, Phoenix, AZ, US, May 2015, pp. 1-4.

Doerr et al., "Silicon Photonics Broadband Modulation-Based Isolator", in Optics Express, vol. 22, Feb. 20, 2014, pp. 4493-4498.

Duarte et al., "Full-Duplex Wireless Communications Using Off-the-Shelf Radios: Feasibility and First Results", in Conference Record of ASILOMAR, Nov. 2010, pp. 1558-1562.

Elkholy et al., "Low-Loss Integrated Passive CMOS Electrical Balance Duplexers with Single-Ended LNA", in IEEE Transactions on Microwave Theory and Techniques, vol. 64, issue 5, May 2016, pp. 1544-1559.

Estep et al., "Magnetic-Free Non-Reciprocity and Isolation Based on Parametrically Modulated Coupled-Resonator Loops", in Nature Physics, vol. 10, Nov. 2014, pp. 923-927.

Estep et al., "Magnetless Microwave Circulators Based on Spatiotemporally Modulated Rings of Coupled Resonators", in IEEE Transactions on Microwave Theory and Techniques, vol. 64, No. 2, Feb. 2016, pp. 502-518.

Estep et al., "On-Chip Non-Reciprocal Components Based on Angular-Momentum Biasing", in the Proceedings of the IEEE International Microwave Symposium, Phoenix, AZ, US, May 2015, pp. 1-4.

Fan et al., "An All-Silicon Passive Optical Diode", in Science, vol. 335, issue 6067, Jan. 2012, pp. 447-450.

Fleury et al., "Sound Isolation and Giant Linear Non-Reciprocity in a Compact Acoustic Circulator", in Science, vol. 343, issue 6170, Jan. 31, 2014, pp. 516-519.

Forbes et al., "Design and Analysis of Harmonic Rejection Mixers with Programmable LO Frequency", in IEEE Journal of Solid-State Circuits, vol. 48, issue 10, Oct. 2013, pp. 2363-2374.

(56) References Cited

OTHER PUBLICATIONS

Galland et al., "On-Chip Optical Non-Reciprocity Using Phase Modulators", in Optics Express, vol. 21, Jun. 2013, pp. 14500-14511.
Gallo et al, "All-Optical Diode in a Periodically Poled Lithium Niobate Waveguide", in Applied Physics Letters, vol. 79, No. 3, Jul. 16, 2001, pp. 314-316.
Ghaffari et al., "Tunable High-Q N-Path Band-Pass Filters: Modeling and Verification", in IEEE Journal of Solid-State Circuits, vol. 46, No. 5, Apr. 2011, pp. 998-1010.
Gharpurey, R., "Linearity Enhancement Techniques in Radio Receiver Front-Ends", in IEEE Transactions on Circuits and Systems, vol. 59, issue 8, Aug. 2012, pp. 1667-1679.
Goel et al., "Tunable Duplexer with Passive Feed-Forward Cancellation to Improve the RX-TX Isolation", in IEEE Transactions on Circuits and Systems, vol. 62, No. 2, Feb. 2015, pp. 536-544.
Hong et al., "Applications of Self-Interference Cancellation in 5G and Beyond", in IEEE Communications Magazine, vol. 52, issue 2, Feb. 2014, pp. 114-121.
International Preliminary Report on Patentability dated Jun. 21, 2018 in International Patent Application No. PCT/US2016/065456.
International Search Report and Written Opinion dated Apr. 5, 2018 in International Patent Application No. PCT/US2017/043402.
International Search Report and Written Opinion dated Aug. 14, 2017 in International patent Application No. PCT/US2016/065456.
Jalas et al., "What Is—and What Is Not—An Optical Isolator", in Nature Photonics, issue 7, Jul. 30, 2013, pp. 579-582.
Kamal et al., "Noiseless Non-Reciprocity in a Parametric Active Device", in Nature Physics, vol. 7, Jan. 30, 2011, pp. 311-315.
Kang et al., "Reconfigurable Light-Driven Opto-Acoustic Isolators in Photonic Crystal Fibre", in Nature Photonics, vol. 5, Sep. 2011, pp. 549-553.
Khanikaev et al., "Topologically Robust Sound Propagation in an Angular-Momentum-Biased Graphene-Like Resonator Lattice", in Nature Communications, vol. 6, Oct. 2015, pp. 1-7.
Kim et al., "A Passive Circulator with High Isolation Using a Directional Coupler for RFID", in the Proceedings of the IEEE International Microwave Symposium, San Francisco, CA, US, Jun. 11-16, 2006, pp. 1177-1180.
Knox, M.E., "Single Antenna Full Duplex Communications using a Common Carrier", in the Proceedings of IEEE WAMICON, Apr. 2012, pp. 1-6.
Kodera et al., "Artificial Faraday Rotaion Using a Ring Metamaterial Structure Without Static Magnetic Field", in Applied Physics Letters, vol. 99, Jun. 2011, pp. 1-3.
Kodera et al., "Magnetless NonReciprocal Metamaterial Technology: Application to Microwave Components", in IEEE Transactions on Microwave Theory and Techniques, vol. 61, No. 3, Mar. 2013, pp. 1030-1042.
Laughlin et al., "Passive and Active Electrical Balance Duplexers", in IEEE Transactions on Circuits and Systems, vol. 63, issue 1, Sep. 25, 2015, pp. 94-98.
LePage et al., "Analysis of a Comb Filter Using Synchronously Commutated Capacitors", in Transactions of the American Institute of Electrical Engineers, vol. 72, issue 1, Mar. 1953, pp. 63-68.
Lira et al., "Broadband Hitless Silicon Electro-Optic Switch for On-Chip Optical Networks", in Optics Express, vol. 17, issue 25, pp. 22271-22280. Dec. 7, 2009.
Lira et al., "Electrically Driven Nonreciprocity Induced by Interband Photonic Transition on a Silicon Chip", in Physical Review Letters, vol. 109, Jul. 20, 2012, pp. 1-5.
Mahmoud et al., "All-Passive Nonreciprocal Metastructure", in Nature Communications, vol. 6, Sep. 28, 2015, pp. 1-7.
Marasevic et al., "Resource Allocation and Rate Gains in Practical Full-Duplex Systems", in IEEE/ACM Transactions on Networking, vol. 25, issue 1, Feb. 2017, pp. 292-305.
Mikhemar et al., "A Multiband RF Antenna Duplexer on CMOS: Design and Performance", in the IEEE Journal of Solid-State Circuits, vol. 48, No. 9, Sep. 2013, pp. 2067-2077.

Mirzaei et al., "Reconfigurable RF Front-Ends for Cellular Receivers", in the Proceedings of the Compound Semiconductor Integrated Circuit Symposium, Monterey, CA, US, Oct. 3-6, 2010, pp. 1-4.
Notice of Allowance dated Aug. 11, 2017 in U.S. Appl. No. 15/391,292.
Office Action dated Apr. 3, 2017 in U.S. Appl. No. 15/391,292.
Office Action dated Aug. 11, 2017 in U.S. Appl. No. 15/391,292.
Oliver et al., "A Monolithic Single-Crystal Yttrium Iron Garnet/Silicon X-Band Circulator", in IEEE Microwave Guided Wave Letters, vol. 7, issue 8, Aug. 1997, pp. 239-241.
Peng et al., "Parity-Time-Symmetric Whispering-Gallery Microactivites", in Nature Physics, issue 10, Sep. 2013, pp. 394-398.
Qin et al., "Nonreciprocal Components with Distributedly Modulated Capacitors", in IEEE Transactions on Microwave Theory and Techniques, vol. 62, No. 10, Oct. 2014, pp. 2260-2272.
Reiskarimian et al., "Analysis and Design of Two-Port N-Path Bandpass Filters With Embedded Phase Shifting", in IEEE Transactions on Circuits and Systems, vol. 63, No. 8, Aug. 2016, pp. 1-5.
Reiskarimian et al., "Design of All-Passive High-Order CMOS N-path Filters", in the Proceedings of IEEE Radio Frequency Integrated Circuits Symposium (RFIC), Phoenix, AZ, US, May 17-19, 2015, pp. 83-86.
Reiskarimian et al., "Magnetic-Free Non-Reciprocity Based on Staggered Commutation", in Nature Communications, vol. 7, No. 4, Apr. 2016, pp. 1-10.
Sabharwal et al., In-Band Full-Duplex Wireless: Challenges and Opportunities, in IEEE Journal on Selected Areas in Communications, vol. 32, No. 9, Sep. 2014, pp. 1637-1652.
Shoji et al., "Magneto-Optical Isolator with Silicon Waveguides Fabricated by Direct Bonding", in Applied Physics Letter, vol. 92, issue 7, Jan. 2008, pp. 1-25.
Skyworks Solutions Inc., "SKYFR-000709: 2110-2170 MHz Single Junction Robust Lead Circulator", Technical Paper, May 7, 2013, pp. 1-4.
Soer et al., "Unified Frequency-Domain Analysis of Switched-Series-Passive Mixers and Samplers", in IEEE Transactions on Circuits and Systems, vol. 57, No. 10, Oct. 2010, pp. 2618-2631.
Soljacic et al, "Nonlinear Photonic Crystal Microdevices for Optical Integration", in Optics Letters, vol. 28, No. 8, Apr. 15, 2003, pp. 637-639.
Sounas et al., "Giant Reciprocity at the Subwavelength Scale Using Angular Momentum-Biased Metamaterials", in Nature Communications, vol. 4, Sep. 2013, pp. 1-7.
Tanaka et al., "The Realization of Circulators Using Transistors", in the Proceedings of the IEEE, vol. 53, issue 3, Mar. 1965, pp. 260-267.
Thomas et al., "Brodband Synthetic Transmission-Line N-Path Filter Design", in IEEE Transactions on Microwave Theory and Techniques, vol. 63, issue 10, Oct. 2015, pp. 3525-3536.
Tyagi et al., "An Advanced Low Power High Performance, Strained Channel 65nm Technology", in the Proceedings of the IEEE International Electron Devices Meetings, Washington, DC, US, Dec. 2005, pp. 1-4.
Van den Broek et al., "A Self-Interference Cancelling Receiver for In-Band Full-Duplex Wireless with Low Distortion under Cancellation of Strong TX Leakage", in Proceedings of the IEEE Solid-State Circuits Conference, San Francisco, CA, US, Feb. 2015, pp. 1-8.
Van Den Broek et al., "An In-Band Full-Duplex Radio Receiver with Passive Vector Modulator Downmixer for Self-Interference Cancellation", in IEEE Journal of Solid State Circuits, vol. 50, No. 12, Dec. 2015, pp. 3003-3014.
Van Liempd et al., "An Electrical-Balance Duplexer for In-Band Full-Duplex with <-85dBm In-Band Distortion at + 10dBm TX-Power", in the Proceedings of the European Solid-State Circuits Conference, Graz, AT, Sep. 14-18, 2015, pp. 1-5.
Vlasov et al., "High-Throughput Silicon Nanophotonic Wavelength-Insensitive Switch for On-Chip Optical Networks", in Nature Photonics, vol. 2, Mar. 2008, pp. 242-246.
Wang et al., "Fully Integrated 10-GHz Active Circulator and Quasi-Circulator Using Bridged-T Networks in Standard CMOS", in IEEE

(56) References Cited

OTHER PUBLICATIONS

Transactions on Very Larg Scale Integration Systems, vol. 24, issue 10, Mar. 15, 2016, pp. 3184-3192.
Wang et al., "Gyrotropic Response in the Abscence of a Bias Field", in the Proceedings of the National Academy of Sciences, vol. 109, No. 33, May 17, 2012, pp. 13194-13197.
Yang et al., "A Wideband Highly Integrated and Widely Tunable Transceiver for In-Band Full-Duplex Communication", in IEEE Journal of Solid State Circuits, vol. 50, No. 5, May 2015, pp. 1189-1202.
Yin, B. et al., "Full-Duplex in Large-Scale Wireless Systems", In Proceedings of the Asilomar Conference no Siganls, Systems, and Computers, Nov. 2013, pp. 1623-1627.
Yu et al., "Complete Optical Isolation Created by Indirect Interband Photonic Transitions", in Nature Photonics, vol. 3, Jan. 11, 2009, pp. 91-94.
Yuksel et al., "A Circuit-Level Model for Accurately Modeling 3rd Order Nonlinearity in CMOS Passive Mixers", in the Proceedings of the IEEE Radio Frequency Integrated Circuits Symposium, Tampa, FL, US, Jun. 1-3, 2014, pp. 127-130.
Zanjani et al., "One-Way Phonon Isolation in Acoustic Waveguides", in Applied Physics Letters, vol. 104, Feb. 2014, pp. 1-5.
Zhang et al., "An Integrated CMOS Passive Self-Interference Mitigation Technique for FDD Radios", in IEEE Journal of Solid-State Circuits, vol. 50, No. 5, May 2015, pp. 1176-1188.
Zhou et al., "Integrated Wideband Self-Interference Cancellation in the RF Domain for FDD and Full-Duplex Wireless", in IEEE Journal of Solid-State Circuits, vol. 50, No. 12, Dec. 2015, pp. 3015-3031.
Zhou et al., "Low-Noise Active Cancellation of Transmitter Leakage and Transmitter Noise in Broadband Wireless Receivers for FDD/Co-Existence", in IEEE Journal of Solid-State Circuits, vol. 49, No. 12, Dec. 2014, pp. 3046-3062.
Zhou et al., "Receiver with Integrated Magnetic-Free N-Path-Filter-Based Non-Reciprocal Circulator and Baseband Self-Interference Cancellation for Full-Duplex Wireless", in the Proceedings of the IEEE International Solid-State Circuits Conference, San Francisco, CA, US, Jan. 31-Feb. 4, 2016, pp. 178-180.
Zhou et al., "Reconfigurable Receiver with >20MHz Bandwidth Self-Interference Cancellation Suitable for FDD, Co-Existence and Full-Duplex Applications", in the Proceedings of the IEEE Solid-State Circuits Conference, San Francisco, CA, US, Feb. 2015, pp. 1-3.
Andrews et al., "What Will 5G Be?" in IEEE Journal on Selected Areas in Communications, vol. 32, No. 6, pp. 1065-1082, Jun. 2014.
Chang et al., "Design and Analysis of 24-GHz Active Isolator and Quasi-Circulator," IEEE Transactions on Microwave Theory and Techniques, vol. 63, No. 8, Aug. 2015, pp. 2638-2649.
Dinc et al., "A 28GHz Magnetic-Free Non-Reciprocal Passive CMOS Circulator Based on Spatio-Temporal Conductance Modulation," in 2017 IEEE International Solid-State Circuits Conference, Feb. 2017, pp. 294-295.
Dinc et al., "A 60 GHz CMOS Full-Duplex Transceiver and Link with Polarization-Based Antenna and RF Cancellation," in IEEE Journal of Solid-State Circuits, vol. 51, No. 5, May 2016, pp. 1125-1140.
Emami et al. "A 60GHz CMOS Phased-Array Transceiver Pair for Multi-Gb/s Wireless Communications," in 2011 IEEE International Solid-State Circuits Conference Digest of Technical Papers, 2011, pp. 164-166.
Giannini et al., "A 79 GHz Phase-Modulated 4 GHz-BW CW Radar Transmitter in 28 nm CMOS," in IEEE Journal of Solid-State Circuits, vol. 49, No. 12, pp. 2925-2937, Dec. 2014.
Hasch et al.,"Millimeter-Wave Technology for Automotive Radar Sensors in the 77 GHz Frequency Band," in IEEE Transactions on Microwave Theory and Techniques, vol. 60, No. 3, pp. 845-860, Mar. 2012.
Li et al., "A Fully Integrated 77GHz FMCW Radar System in 65nm CMOS," in 2010 IEEE International Solid-State Circuits Conference Digest of Technical Papers, Feb. 2010, pp. 216-217.
Mikhemar et al., "A Tunable Integrated Duplexer with 50dB Isolation in 40nm CMOS," in 2009 IEEE International Solid-State Circuits Conference—Digest of Technical Papers, Feb. 2009, pp. 386-387.
Natarajan et al., "A Fully-Integrated 16-Element Phased-Array Receiver in SiGe BiCMOS for 60-GHz Communications," in IEEE Journal of Solid-State Circuits, vol. 46, No. 5, pp. 1059-1075, May 2011.
Reiskarimian et al., "A CMOS Passive LPTV Nonmagnetic Circulator and its Application in a Full-Duplex Receiver," in IEEE Journal of Solid-State Circuits, vol. 52, No. 5, May 2017, pp. 1358-1372.
Tellegen, B., "The Gyrator a New Electric Network Element," in Philips Res. Rep., Apr. 1948, pp. 81-101.
Van Liempd et al., "A +70dBm IIP3 Single-Ended Electrical Balance Duplexer in 0.18μm SOI CMOS," in ISSCC, Feb. 2016, pp. 32-33.
Wu et al., "CMOS Active Quasi-Circulator with Dual Transmission Gains Incorporating Feedforward Technique at K-Band," in IEEE Transactions on Microwave Theory and Techniques, vol. 58, No. 8, Aug. 2010, pp. 2084-2091.
Zander et al., "Riding the Data Tsunami in the Cloud: Myths and Challenges in Future Wireless Access," IEEE Communications Magazine, vol. 51, No. 3, pp. 145-151, Mar. 2013.
Zhu et al., "Demystifying 60GHz Outdoor Picocells," in Proceedings of the 20th Annual International Conference on Mobile Computing and Networking. New York, NY, USA, Sep. 7-11, 2014, pp. 5-16.
Office Action dated Aug. 30, 2019 in U.S. Appl. No. 16/318,074.

* cited by examiner

Linearity Enhancement in N-path Filters

![US 10,581,135 B2]

CIRCUITS AND METHODS FOR NON-RECIPROCAL CIRCULATORS AND TRANSCEIVERS USING SAME

CROSS-REFERENCE TO RELATED APPLICATIONS

This application claims the benefit of U.S. Provisional Patent Application No. 62/264,312, filed Dec. 7, 2015, U.S. Provisional Patent Application No. 62/271,297, filed Dec. 27, 2015, and U.S. Provisional Patent Application No. 62/346,977, filed Jun. 7, 2016, each of which is hereby incorporated by reference herein in its entirety.

STATEMENT REGARDING GOVERNMENT FUNDED RESEARCH

This invention was made with government support under contract FA8650-14-1-7414 awarded by the Air Force Materiel Command Legal Office and contract HR0011-12-1-0006 awarded by the Defense Advanced Research Projects Agency. The government has certain rights in the invention.

BACKGROUND

Full-duplex communications, in which a transmitter and a receiver of a transceiver operate simultaneously on the same frequency band, is drawing significant interest for emerging 5G communication networks due to its potential to double network capacity compared to half-duplex communications. However, one of the biggest challenges from an implementation perspective is the antenna interface.

One way in which an antenna interface for a full-duplex transceiver can be implemented is using a non-reciprocal circulator. Reciprocity in electronics is a fundamental property of linear systems and materials described by symmetric and time-independent permittivity and permeability tensors. Non-reciprocity in a circulator causes signals to travel in only one direction through the circulator. This unidirectional signal flow enables full-duplex wireless communications because signals from a transmitter can be only directed toward an antenna (and not the receiver) and received signals at the antenna can be only directed toward the receiver (and not the transmitter). Thus, a circulator allows transmitter-to-antenna signal transmission and antenna-to-receiver signal transmission with very low loss, and provides isolation to the receiver from the transmitter, thus protecting the receiver from the transmitter's interference.

Conventionally, non-reciprocal circulators have been implemented using ferrite materials, which are materials that lose their reciprocity under the application of an external magnetic field. However, ferrite materials cannot be integrated into CMOS IC technology. Furthermore, the need for an external magnet renders ferrite-based circulators bulky and expensive.

Accordingly, new mechanisms for implementing circulators and full duplex wireless transceivers are desirable.

SUMMARY

In accordance with some embodiments, non-reciprocal circulators are provided, the circulators comprising: a $3\lambda/4$-long ring section having a first end and a second end, wherein $\lambda$ is an operating wavelength of the non-reciprocal circulator; and a N-path filter having a first port, a second port, and N-paths, each of the N-paths being connected to the first port and the second port. In some of these embodiments, the $3\lambda/4$-long ring section includes a transmit port, an antenna port, and a receive port. In some of these embodiments, the transmit port is $\lambda/4$ away from the antenna port. In some of these embodiments, the antenna port is $\lambda/4$ away from the receive port. In some of these embodiments, the receive port is at the first port of the N-path filter. In some of these embodiments, the $3\lambda/4$-long ring section is formed from three lumped capacitor-inductor-capacitor (CLC) networks, each have a length of $\lambda/4$ and each having a first side and a second side, wherein: the first side of a first of the three CLC networks is connected to the first port of the N-path filter; the first side of a second of the three CLC networks is connected to the second side of the first of the three CLC networks; the first side of a third of the three CLC networks is connected to the second side of the second of the three CLC networks; and the second side of the third of the three CLC networks is connected to the second port of the N-path filter. In some of these embodiments, each of the three lumped CLC networks has: a first capacitor having a first side connected to the first side of the CLC network and having a second side; an inductor having a first side connected to the second side of the first capacitor and having a second side connected to ground; and a second capacitor having a first side connected to the second side of the first capacitor and having a second side connected to the second side of the CLC network. In some of these embodiments, the $3\lambda/4$-long ring section is formed from three transmission lines, each with a length of $\lambda/4$. In some of these embodiments, the N-path filter has eight paths. In some of these embodiments, a first path of the N-path filter has: a first side and a second side; a first switch having a first side connected to the first side of the first path and having a second side; a capacitor having a first side connected to the second side of the first switch and having a second side connected to ground; and a second switch having a first side connected to the second side of the first switch and having a second side connected to the second side of the first path. In some of these embodiments, the first switch of the first path is a first transistor and the second switch of the first path is a second transistor. In some of these embodiments, the first switch of the first path is controlled by a first oscillator having a duty cycle of 1/N, wherein the second switch of the first path is controlled by a second oscillator having a duty cycle of 1/N, and wherein the first oscillator and the second oscillator are 90 degrees apart. In some of these embodiments, a second path of the N-path filter has: a first side and a second side; a first switch having a first side connected to the first side of the second path and having a second side; a capacitor having a first side connected to the second side of the first switch and having a second side connected to ground; and a second switch having a first side connected to the second side of the first switch and having a second side connected to the second side of the second path. In some of these embodiments, the first switch of the second path is a first transistor and the second switch of the second path is a second transistor. In some of these embodiments, the first switch of the second path is controlled by a third oscillator having a duty cycle of 1/N, wherein the second switch of the second path is controlled by a fourth oscillator having a duty cycle of 1/N, and wherein the third oscillator and the fourth oscillator are 90 degrees apart. In some of these embodiments, the third oscillator turns ON when the first oscillator turns OFF, and the fourth oscillator turns ON when the second oscillator turns OFF.

DETAILED DESCRIPTION

In accordance with some embodiments, non-reciprocal circulators are provided. In accordance with some embodiments, transceivers including non-reciprocal circulators are provided. In accordance with some embodiments, complementary metal-oxide semiconductor (CMOS) integrated circuit (IC) implementations of transceivers including non-reciprocal circulators are provided. Such circulator and circulator-transceivers can be used to implement full-duplex wireless communications (e.g., for cellular and/or WiFi applications) in some embodiments.

In some embodiments, non-reciprocal circulators are based on a staggered-commutation.

Figure 1:
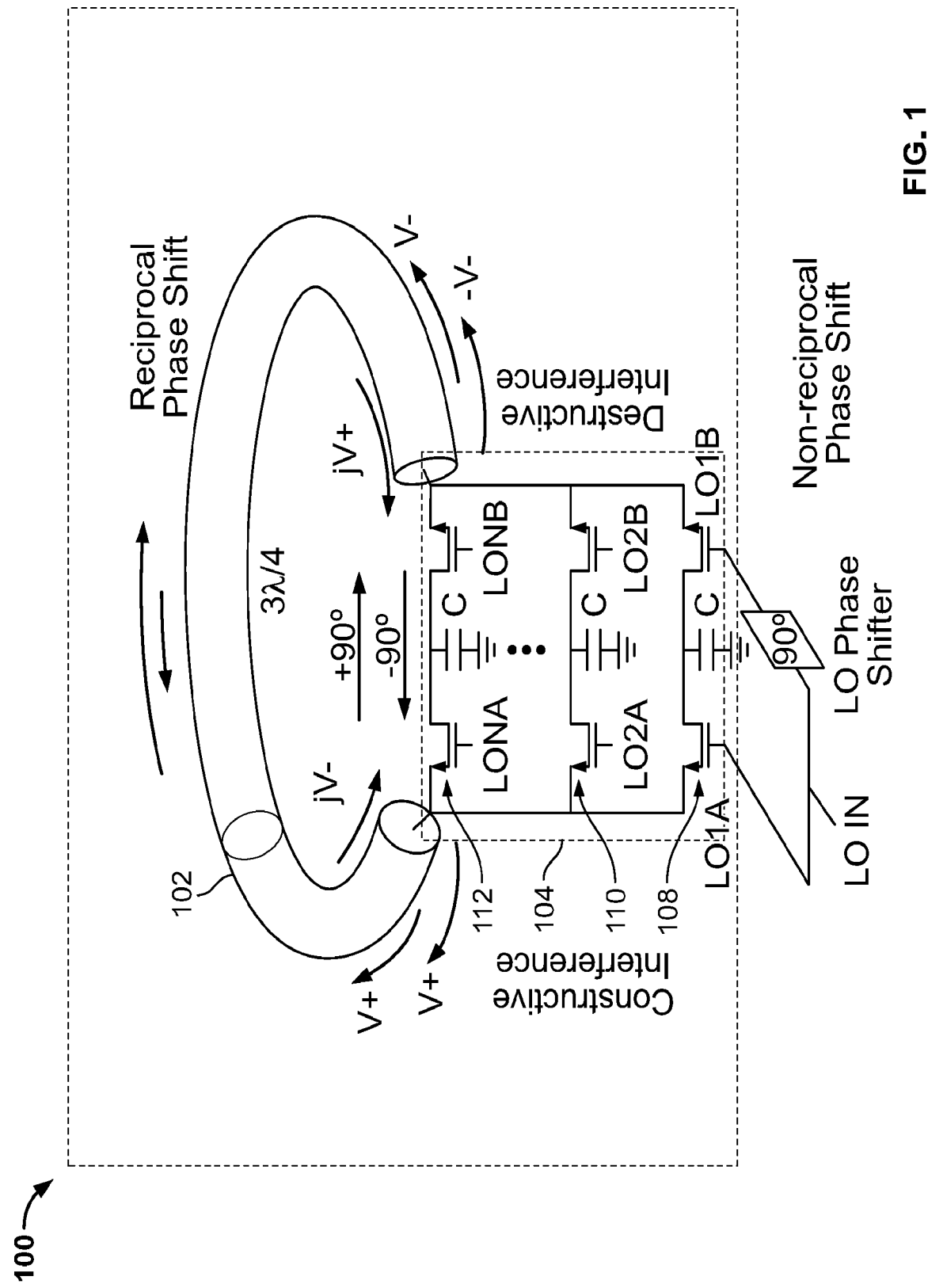
FIG. 1 is an illustration of a non-reciprocal circulator formed from an N-path filter and ¾-wavelength-long ring in accordance with some embodiments.

Turning to FIG. 1, an example 100 of a staggered-commutated circulator in accordance with some embodiments is shown. As illustrated, circulator 100 includes a 3λ/4-long ring section 102 and an N-path filter (NPF) 104.

3λ/4-long ring section 102 can be implemented in any suitable manner in some embodiments. For example, in some embodiments, ring section 102 can be implemented using a transmission line having a length of 3λ/4, where λ is the operating wavelength of the circulator. As another example, in some embodiments, ring section 102 can be formed three lumped CLC networks each having a length of λ/4 (as described further below).

NPF 104 can be any suitable N-path filter in some embodiments. For example, as shown in FIG. 1, the NPF can be formed from parallel branches 108, 110, and 112 (although three branches are illustrated for the purposed of drawing clarity, any suitable number of branches can be used) of filter elements. Each of these branches of filter elements can be formed in any suitable manner. For example, in some embodiments, each branch of filter elements can be formed from two switches (which can each be implemented using one or more transistors) and a capacitor (or group of capacitors) as illustrated.

In accordance with some embodiments, to create non-reciprocal wave propagation in circulator 100, NPF 104 can be operated as a non-reciprocal N-path-filter with +/−90 degree phase shift inside the 3λ/4-long ring section. This results in satisfaction of the boundary condition in one direction (−270 degree phase-shift from the ring section added with −90 degree phase-shift from the N-path filter for a total of −360 degree phase-shift) but not in the opposite direction (−270 degree phase-shift from the ring section added with +90 degree phase-shift from the N-path filter for a total of −180 degree phase-shift). As a result, waves can propagate in only one direction in the ring section.

Figure 2:
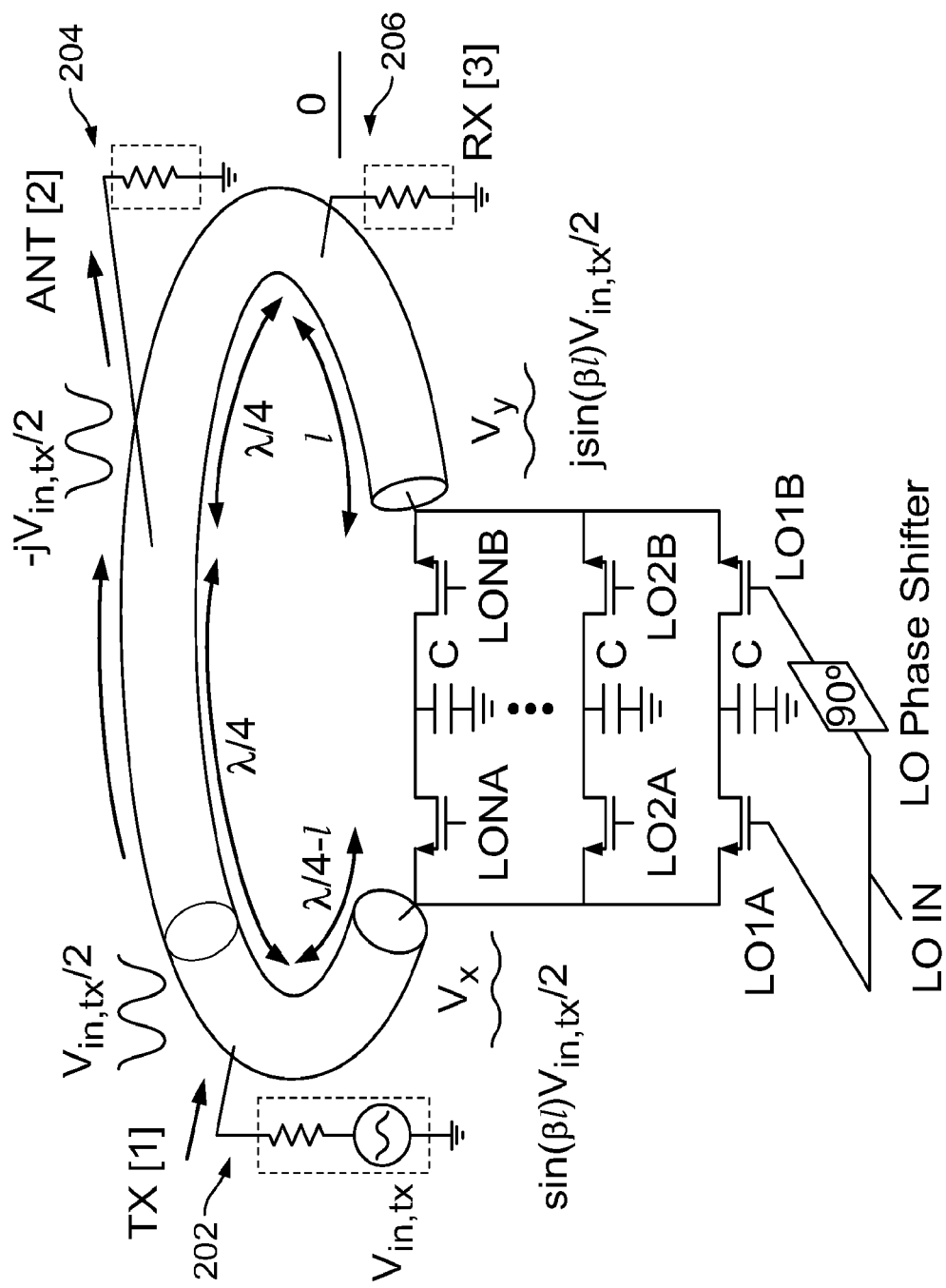
FIG. 2 is another illustration of a non-reciprocal circulator formed from an N-path filter and ¾-wavelength-long ring in accordance with some embodiments.

As shown in FIG. 2, a three-port circulator can be realized by placing ports anywhere along the 3λ/4-long ring section as long as the ports maintain a λ/4 circumferential distance between them, where λ is the operating wavelength of the non-reciprocal circulator. For example, as illustrated, the circulator can include a transmit (TX) port [1] 202, an antenna (ANT) port [2] 204, and a receive (RX) port [3] 206.

A complete S-parameters of a two-port N-path filter at the center frequency ($f_s$) with 90 degree phase-shift between the clock sets (assuming $C \gg 1/(2\pi f_s Z_0)$ for filtering), can be written as:

$$S(f_s) \approx \begin{bmatrix} \dfrac{N^2\left(1-\cos\left(\frac{2\pi}{N}\right)\right)}{2\pi^2} - 1 & \dfrac{N^2\left(1-\cos\left(\frac{2\pi}{N}\right)\right)}{2\pi^2} e^{-j\pi/2} \\ \dfrac{N^2\left(1-\cos\left(\frac{2\pi}{N}\right)\right)}{2\pi^2} e^{+j\pi/2} & \dfrac{N^2\left(1-\cos\left(\frac{2\pi}{N}\right)\right)}{2\pi^2} - 1 \end{bmatrix} \quad (1)$$

$$N \underset{\to \infty}{\approx} \begin{bmatrix} 0 & e^{-j\pi/2} \\ e^{+j\pi/2} & 0 \end{bmatrix}$$

where N is the number of paths, C is the capacitance in each path, and $Z_0$ is the reference impedance. The term $$\dfrac{N^2\left(1-\cos\left(\frac{2\pi}{N}\right)\right)}{2\pi^2}$$

in equation (1) is referred to herein as α.

Figure 3:
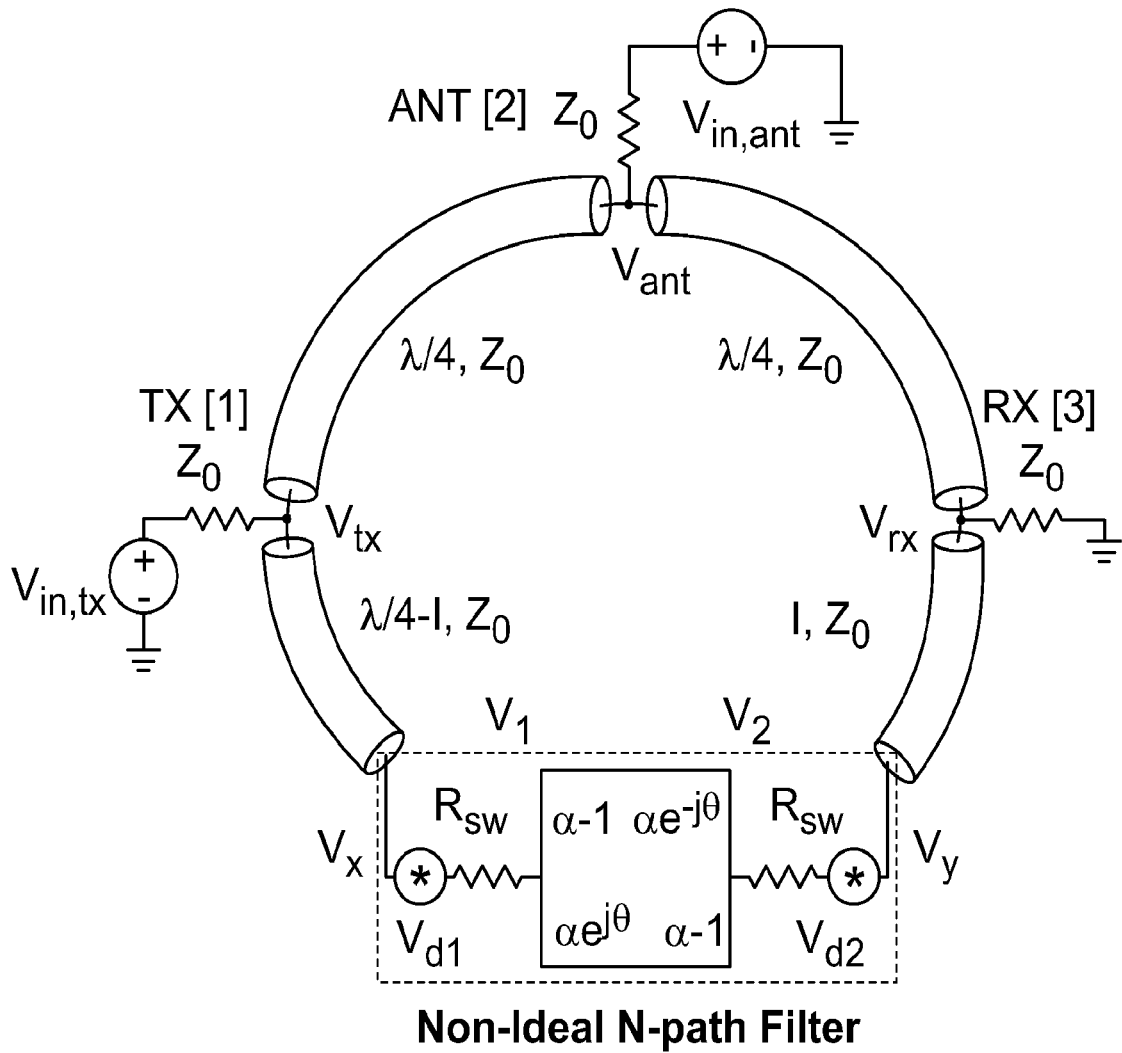
FIG. 3 is still another illustration of a non-reciprocal circulator formed from an N-path filter and ¾-wavelength-long ring in accordance with some embodiments.

To simplify the analysis, an approximate model is shown in FIG. 3 in which the N-path filter is modeled with its S-parameters at the operating frequency ($f_s$) and two series resistances ($R_{sw}$) representing the resistance of the switches. The behavior of an N-path filter depends on the source and load impedances, and the use of the S-parameters presented in equation (1) that were derived with 50 ohm source and load impedances represents an approximation to avoid a full LPTV analysis of the entire circulator circuit.

Using conventional microwave circuit analysis techniques, thirteen equations are needed to fully solve the circuit unknowns. These thirteen unknowns consist of eight wave amplitudes (forward and backward waves propagating in each section of the 3λ/4-length ring section) and five node voltages $V_{tx}$, $V_{ant}$, $V_{rx}$, $V_x$, and $V_y$. For an ideal N-path filter (N→∞, α→0, $R_{sw}$=0) and ideal lossless ring sections, the overall S-parameters of the circulator and the port voltages for an excitation $V_{in,tx}$ at the TX port ($V_{in,ant}$=0) are:

$$V_{tx} = \frac{1}{2}V_{in,tx}, V_{ant} = \frac{-j}{2}V_{in,tx}, V_{rx} = 0, \quad (2)$$

$$V_x = \frac{\sin(\beta l)}{2}V_{in,tx}, V_y = \frac{j\sin(\beta l)}{2}V_{in,tx},$$

$$S_{circ}(f_s) = \begin{bmatrix} 0 & 0 & -1 \\ -j & 0 & 0 \\ 0 & -j & 0 \end{bmatrix} \quad (3)$$

These S-parameters correspond to an ideal circulator with 0 dB loss and perfect matching at each port. As can be seen from Eq. (2), the voltages on either side of the N-path filter ($V_x$, $V_y$) have a magnitude of:

$$\frac{\sin(\beta l)}{2}V_{in,tx}$$

Interestingly, by setting l, the distance from the RX port to the N-path filter, to zero, the voltages across the N-path filter remain quiet for excitations at the TX port, thus enhancing the TX-ANT linearity compared to ANT-RX.

Figure 4:
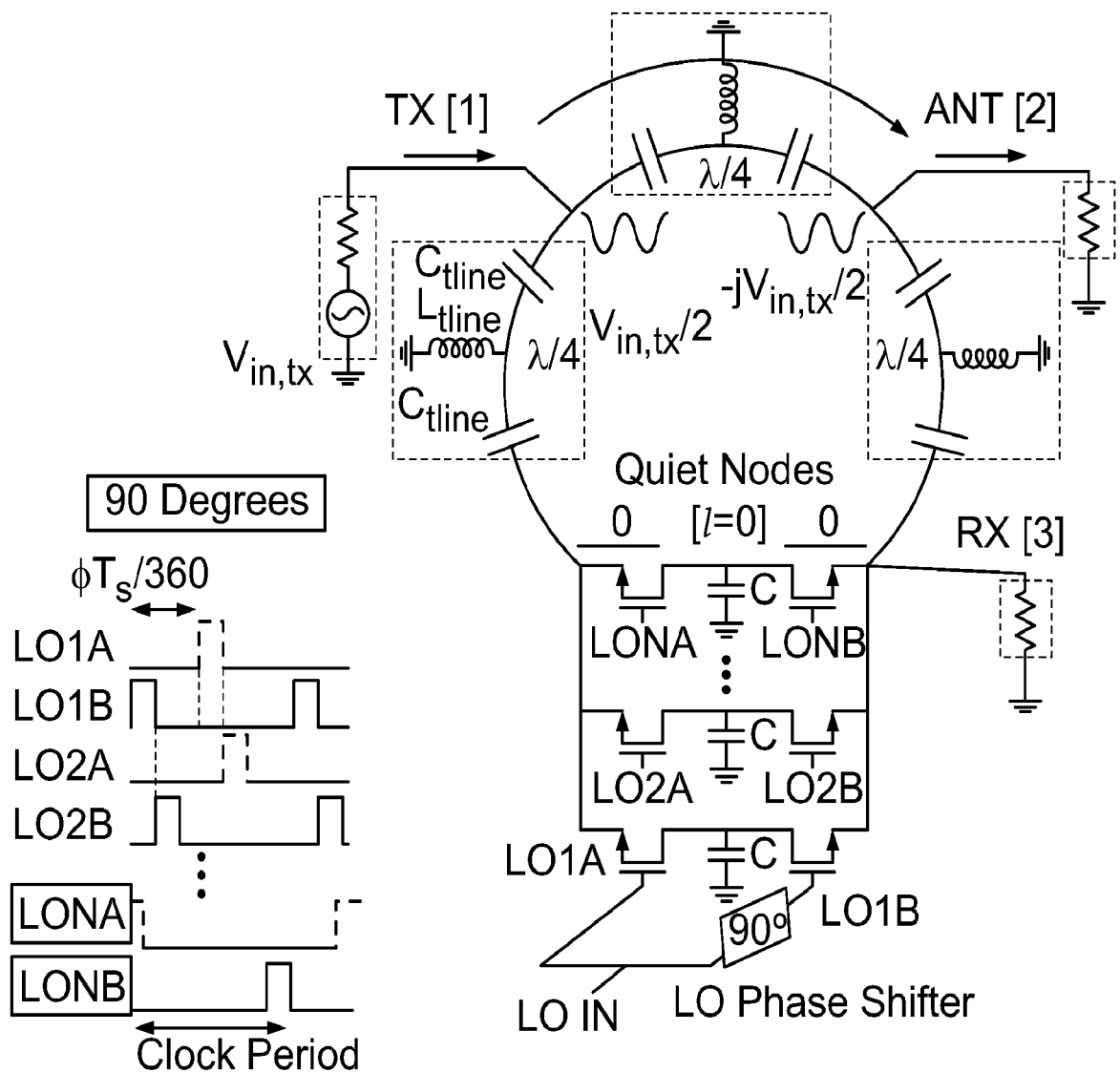
FIG. 4 is yet another illustration of a non-reciprocal circulator formed from an N-path filter and ¾-wavelength-long ring in accordance with some embodiments.

FIG. 4 depicts such a linearity-enhanced circulator where the ring section has been further miniaturized using lumped CLC equivalent circuits. During operation, the gates of the transistors of FIG. 4 can be driven by local oscillator signals LO1A, LO1B, LO2A, LO2B, LONA, and LONB, respectively, as shown in the example timing diagram of FIG. 4. As illustrated, LO1B is shifted 90 degrees from LO1A, LO2B is shifted 90 degrees from LO2A, and LONB is shifted 90 degrees from LONA. These local oscillator signals can have any suitable frequency, such as the operating frequency of the circulator (e.g., 750 MHz).

The transistors of FIG. 4 are configured to act as switches, and maybe referred to as switches and/or substituted with any component that can act as a switch in the circuit.

In reality, the N-path filter is implemented using finite number of paths (N) and non-zero switch resistance ($R_{sw}$). In such a case, the TX-ANT loss ($S_{21}$) and TX-RX isolation ($S_{31}$) can be calculated for l=0 as:

$$S_{21} = \frac{-jZ_0}{Z_0 + R_{sw}}, S_{31} = \frac{-R_{sw}Z_0\left(\frac{1}{\alpha} - 1\right)}{(Z_0 + R_{sw})\left(Z_0 + \left(\frac{1}{\alpha} - 1\right)(Z_0 + R_{sw})\right)}$$

An equation for $V_x$ under TX port excitation can be derived as follows:

$$V_x = \frac{-jR_{sw}Z_0\left(2 + \left(\frac{1}{\alpha} - 1\right)\left(1 + \frac{2R_{sw}}{Z_0}\right)\right)}{2(Z_0 + R_{sw})\left(Z_0 + \left(\frac{1}{\alpha} - 1\right)(Z_0 + R_{sw})\right)}V_{in,tx}$$

Interestingly, the TX-ANT loss is independent of N and only depends on $R_{sw}$, while the isolation depends on both $R_{sw}$ and N (via α). For N→∞ (α→1), the isolation becomes perfect ($S_{31}$=0, i.e., $V_{rx}$=0 for TX port excitations) and $$|V_x| = \left|\frac{R_{sw}V_{in,tx}}{Z_0 + R_{sw}}\right|.$$

For $R_{sw}$=0, the isolation becomes perfect as well and $V_{rx}=V_x=0$ for TX port excitations.

As mentioned above, in the ideal scenario, the voltages across the N-path filter are quiet for TX-port excitations, and the TX linearity is enhanced substantially. When finite N and non-zero $R_{sw}$ are considered, the linearity enhancement will be related to the finite magnitude of the voltages $V_{rx}$ and $V_x$. As N is increased, the linearity enhancement is limited by the voltage swing at $V_x$. However, decreasing $R_{sw}$ increases the linearity enhancement as both $V_{rx}$ and $V_x$ are suppressed.

Similarly, the ANT-RX loss ($S_{32}$) can be calculated as:

$$S_{32} = \frac{-jZ_0\left(1 + \left(\frac{1}{\alpha} - 1\right)\frac{R_{sw}}{Z_0}\right)}{\left(Z_0 + \left(\frac{1}{\alpha} - 1\right)(Z_0 + R_{sw})\right)}$$

The ANT-RX loss depends on both $R_{sw}$ and N. For N→∞ (α→1), the ANT-RX loss becomes perfect ($S_{31}$=−j). Further, for ANT port excitations, the voltages on both sides of the N-path filter have the same magnitude:

$$\left(|V_x| = |V_{rx}| = \left|\frac{S_{32}}{2}V_{in,ant}\right|\right).$$

In other words, the ANT excitation appears in common mode across the N-path filter. Due to this fact, the in-band (IB) ANT-RX linearity is identical to the linearity of the N-path filter.

Figure 5:
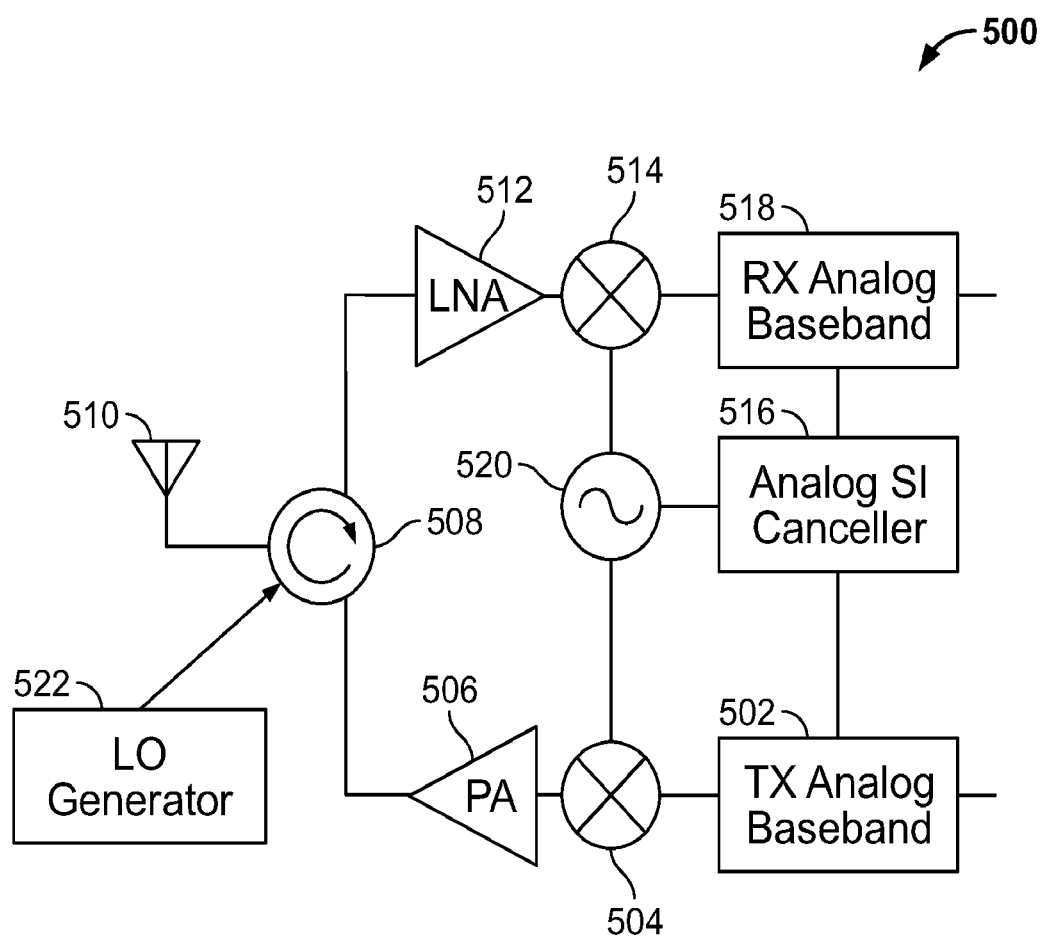
FIG. 5 is block diagram of a transceiver using a non-reciprocal circulator in accordance with some embodiments.

Turning to FIG. 5, an example 500 of a block diagram of a transceiver in accordance with some embodiments is shown. As illustrated, a transmitter analog baseband signal 502 is upconverted by mixer 504 using a local oscillator from generator 520. The upconverted signal is then amplified by power amplifier 506 and provided to circulator 508, which directs the signal to antenna 510 for transmission. Signals received at antenna 510 are directed by circulator 508 to the input of low noise amplifier 512, which amplifies the received signal. Mixer 514 then downconverts the amplified signal using a local oscillator from generator 520. Based on transmitter analog baseband signal 502, analog self-interference canceller 516 provides a signal that, when combined with the output of mixer 514, cancels at least some of the self-interference that would otherwise be present in receiver analog baseband 518. In some embodiments, analog self-interference cancellation (SIC) can be implemented as described below in connection with FIG. 6. Circulator 508 can be driven by local oscillator generator 522.

In FIG. 5, mixers 504 and 514 can be any suitable mixer, generator 520 can be any suitable local oscillator generator, power amplifier 506 can be any suitable power amplifier, LNA 512 can be any suitable low noise amplifier, antenna 510 can be any suitable antenna, circulator 508 can be any suitable non-reciprocal circulator (e.g., such as the nonreciprocal circulator of FIG. 4). Local oscillator 522 can be any suitable local oscillator generator, such as local oscillator generator 616 as described below in connection with FIG. 6.

Figure 6:
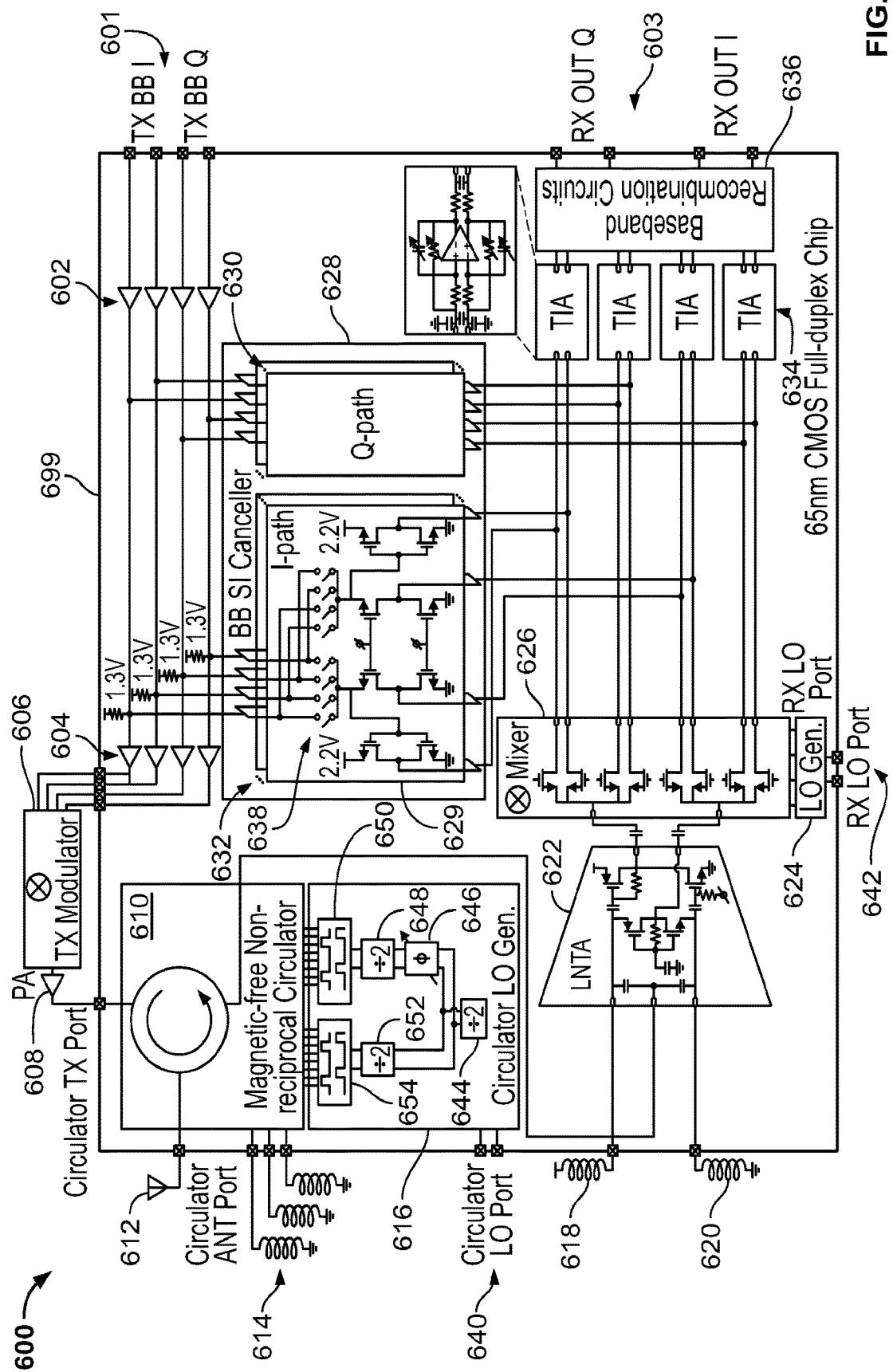
FIG. 6 is a schematic of a transceiver using a non-reciprocal circulator in accordance with some embodiments.

Turning to FIG. 6, a more detailed example 600 of a transceiver in accordance with some embodiments is shown. In some embodiments, box 699 can represent a chip on which the encompassed components are implemented. In some embodiments, such a chip can be implemented in 65 nm CMOS technology.

As illustrated, transceiver 600 is implemented using transmit baseband buffers 602 and 604, a transmit modulator 606, a power amplifier 608, a non-reciprocal circulator 610 (of which inductors 614 are a part), an antenna 612, a circulator local oscillator (LO) generator 616, inductors 618 and 620, a common-gate, common-source low-noise transconductance amplifier (LNTA) 622, a receiver (RX) LO generator 624, a four-phase passive mixer 626, an analog baseband (BB) self-interference canceller (SIC) 628, transimpedance amplifiers (TIAs) 634, and analog baseband recombination circuitry 636.

Transmit baseband buffers 602 and 604 can be any suitable baseband buffers in some embodiments.

Transmit modulator 606 can be any suitable modulator in some embodiments. For example, in some embodiments, modulator 606 can be implemented using part number TRF370417 available from Texas Instruments (of Dallas, Tex.).

Power amplifier 608 can be any suitable power amplifier in some embodiments.

Non-reciprocal circulator 610 can be any suitable non-reciprocal circulator in some embodiments. For example, in some embodiments, non-reciprocal circulator can be implemented using non-reciprocal circulator of FIG. 4.

Antenna 612 can be any suitable antenna in some embodiments.

Inductors 618 and 620 can be any suitable inductors for use with LNTA 622 in some embodiments.

Common-gate, common-source low-noise transconductance amplifier (LNTA) 622 can be any suitable LNTA in some embodiments. For example, in some embodiments, LNTA 622 can be implemented as shown in the schematic of FIG. 6.

Four-phase passive mixer 626 can be any suitable four-phase passive mixer in some embodiments. For example, in some embodiments, mixer 626 can be implemented as shown in the schematic of FIG. 6.

Transimpedance amplifiers (TIAs) 634 can be any suitable TIAs in some embodiments. For example, in some embodiments, TIAs 634 can be implemented as shown in the schematic of FIG. 6.

Analog baseband recombination circuitry 636 can be any suitable analog baseband recombination circuitry in some embodiments. For example, recombination circuitry 636 can be implemented using voltage to current converting $g_m$ cells as shown in circuitry 734 of FIG. 7. The recombination circuit may be formed from multiple pairs of $g_m$s to form I/Q outputs of the receiver.

During operation, transmit signals received at baseband I and Q inputs 601 are amplified by buffers 602 and 604, modulated by modulator 606, amplified by amplifier 608, directed to antenna 612 by circulator 610, and transmitted by antenna 612. Signals received at antenna 612 are directed by circulator 610 to LNTA 622, amplified by LNTA 622, down-converted by mixer 626, amplified by TIAs 634, converted to I and Q baseband outputs by circuitry 636, and output at outputs 603. Analog BB SIC 628 taps from the transmit baseband signals between the baseband buffers 602 and 604, adjusts the amplitude and the phase of the tapped signals, and injects cancellation currents at the inputs to TIA 634.

Amplitude and phase scaling in analog BB SIC 628 is achieved through two five-bit digitally-controlled phase rotators 630 and 632 injecting into the I-paths and the Q-paths of the RX analog BB, respectively. Each phase rotator can include 31 (or any other suitable number) identical cells with independent controls 638 (these controls can determine the contribution of each cell to the analog BB SIC current). Each cell, which can be implemented in any suitable manner in some embodiments (e.g., such as shown in box 629), of the phase rotator adopts a noise-canceling common-gate (CG) and common-source (CS) topology, allowing partial cancellation of the noise from the CG devices (dependent on the phase rotator setting at controls 638).

Circulator 610 can be implemented in any suitable manner in some embodiments, such as shown in FIG. 4 with N equal to eight. As illustrated, the 3λ/4-long ring section of the circulator may be implemented using three lumped CLC networks having a length of λ/4, an RX port that is at one side of the NPF, an ANT port that is λ/4 away from the RX port (as a result of a first of the CLC networks), and a TX port that is λ/4 away from the ANT port (as a result of a second of the CLC networks) and that is λ/4 away from the other side of the NPF (as a result of a third of the CLC networks).

In some embodiments, the capacitors of the NPF of circulator 610 can be implemented in any suitable manner and have any suitable size. For example, in some embodiments, these capacitors can be 26 pF each (which is roughly six times $1/(2\lambda f_s Z_0)$ ($f_s$ being the operating frequency of 750 MHz; and $Z_0$=50 ohms)), and each can be realized on chip as a pair of 80 μm×80 μm metal-insulator-metal capacitors.

In some embodiments, the capacitors of the lumped CLC sections of circulator 610 can be implemented in any suitable manner. For example, in some embodiments, they can be 4.1 pF each, and each can be realized on chip as a 100 μm×20 μm metal-insulator-metal capacitor.

In some embodiments, the inductors of the lumped CLC sections of circulator 610 can be implemented off-chip (as represented by inductors 614 shown in FIG. 6) using air-core 8.9 nH inductors (0806SQ from Coilcraft (of Cary, Ill.), QL>100).

Circulator 610 receives from circulator LO generator 616 two sets of eight non-overlapping clock signals each with 12.5% duty cycle. These clock signals are used to control the switches in the eight paths of the N-path filter of circulator 610.

Generator 616 can be implemented in any suitable manner in some embodiments. For example, in some embodiments, to generate these clock signals, generator 616 receives two differential (0 degree and 180 degree) input clocks that run at four times the desired commutation frequency. A divide-by-two frequency-divider circuit 644 generates four quadrature clocks with 0 degree, 90 degree, 180 degree, and 270 degree phase relationship. These four clock signals drive two parallel paths for the two sets of switches.

In a first of the two paths, a programmable phase shifter 646 that allows for arbitrary staggering between the two commutating switch sets is provided. Programmable phase shifter 646 enables switching between −90 degree and +90 degree staggering, which allows dynamic reconfiguration of the circulation direction. The phase shifter also allows for fine tuning of the staggered phase shift to optimize the transmission loss in the circulation direction and isolation in the reverse direction. After phase shifting, another divide-by-two circuit 648 and a non-overlapping 12.5% duty-cycle clock generation circuit 650 create the clock signals that control the commutating transistor switches in the first path.

In a second of the two paths, directly after first divide-by-two frequency-divider circuit 644, another divide-by-two circuit 652 and a non-overlapping 12.5% duty-cycle clock generation circuit 654 create the clock signals that control the commutating transistor switches in the second path.

Divide-by-two circuits 644, 648, and 652, phase shifter 646, and non-overlapping 12.5% duty-cycle clock generation circuits 650 and 654 can be implemented in any suitable manner.

In some embodiments, circulator LO generator 616 may use static 90 degree phase-shifts or digital phase interpolators that preserve the square-wave nature of the clock.

At RX LO port 642, RX LO generator 624 receives two differential (0 degree and 180 degree) input clocks that run at two times the operating frequency of the receiver (e.g., 750 MHz). A divide-by-two frequency-divider circuit (which can be implemented in any suitable manner) in generator 624 generates four quadrature clocks with 0 degree, 90 degree, 180 degree, and 270 degree phase relationship.

In some embodiments, although not shown, an impedance tuner can be provided to counter reflections due to antenna impedance mismatch. The tuner can be used at the ANT port for joint optimization of SIC bandwidth (BW) between the circulator and the analog BB canceller.

In some embodiments, transceivers take advantage of inherent down-conversion of an N-path filter to merge a circulator and a receiver.

Figure 7:
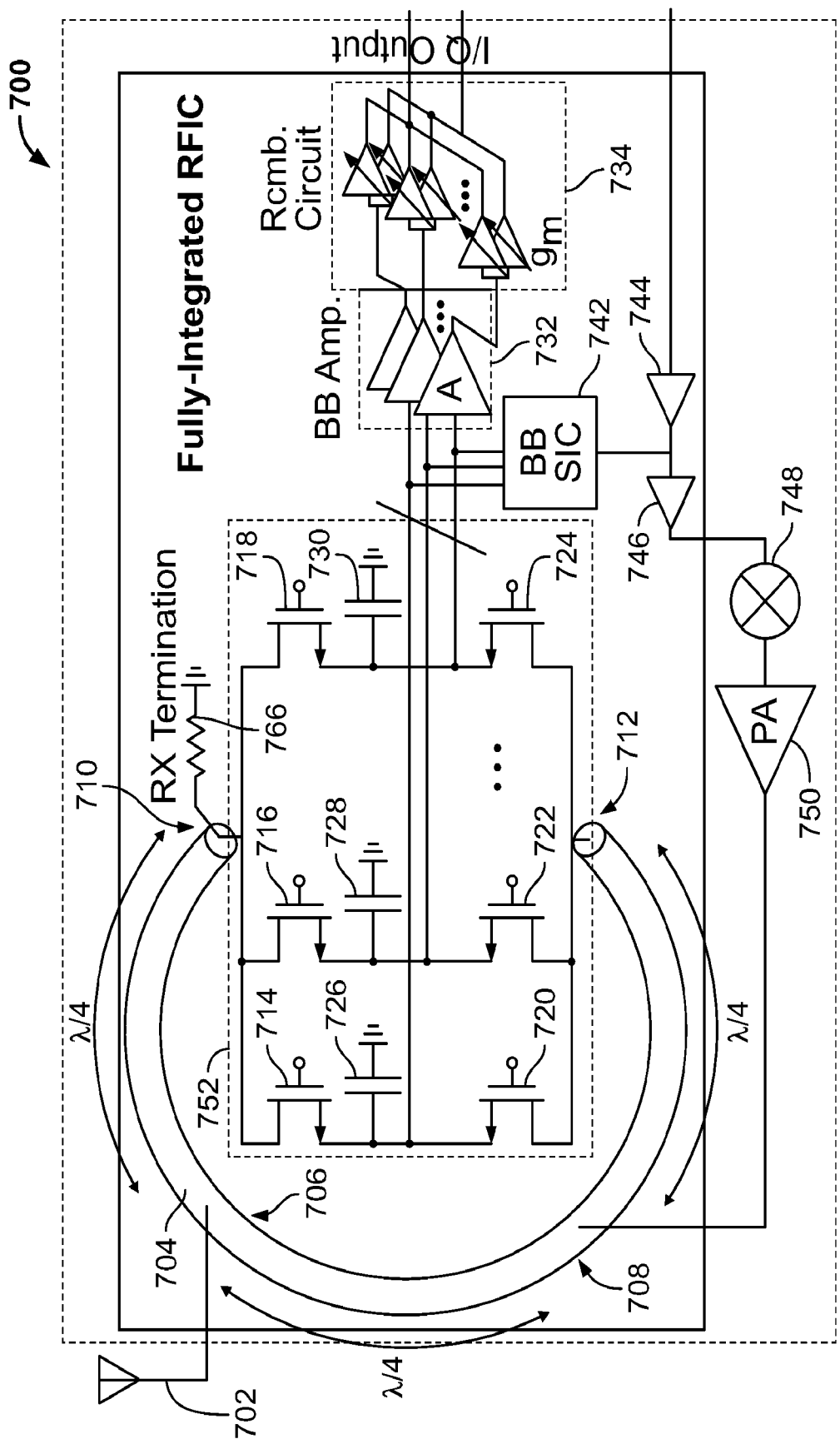
FIG. 7 is a schematic of another transceiver using a non-reciprocal circulator in accordance with some embodiments.

An example 700 of a transceiver that merges a circulator and a receiver is illustrated in FIG. 7 in accordance with some embodiments. As shown, circulator-transceiver 700 includes an antenna 702, a 3λ/4-long ring section 704, a resistor 766, an N-path filter (NPF) 752, a baseband (BB) amplifier 732, a baseband (BB) recombination circuit 734, a baseband (BB) self-interference-cancellation (SIC) circuit 742, amplifiers 744 and 746, a mixer 748, and a power amplifier 750. Any other suitable components can additionally or alternatively be included in circulator-transceiver 700 in some embodiments.

Antenna 702 can be any suitable antenna and can be considered part of or separate from circulator-transceiver 700.

3λ/4-long ring section 704 can be implemented in any suitable manner in some embodiments. For example, in some embodiments, ring section 704 can be implemented using a transmission line having a length of 3λ/4, where λ is the operating wavelength of the circulator. As another example, in some embodiments, ring section 704 can be formed three lumped CLC networks each having a length of λ/4.

As shown in FIG. 7, antenna 702 can connect to ring section 704 at point 706, which can be considered to be an antenna (ANT) port of the ring section and can be at any suitable position on the ring section. For example, point 706 can be λ/4 (as described below) away from points 710 and 708. Likewise, power amplifier 750 can connect to ring section 704 at point 708, which can be considered to be a transmitter (TX) port of the ring section and can be at any suitable position on the ring section. For example, point 708 can be λ/4 (as described below) away from points 706 and 712. Also likewise, NPF 752 can connect to ring section 704 at points 710 and 712. In some embodiments, resistor 766 can also connect to the ring section at point 710.

N-path filter (NPF) 752 can be implemented in any suitable manner. For example, in some embodiments, NPF 752 can be implemented using transistors 714, 716, 718, 720, 722, and 724 (which are configured to act as switches, and may be referred to as switches and/or substituted with any component that can act as a switch in the circuit) and capacitors 726, 728, and 730, connected as shown in FIG. 7. In this arrangements, transistors 714 and 720 and capacitor 726 form a path, transistors 716 and 722 and capacitor 728 form another path, and transistors 718 and 724 and capacitor 730 form still another path of the N-path filter. Any suitable numbers of paths can be included in the NPF, and hence any suitable numbers of transistors and capacitors can be included.

Baseband amplifier 732 can be implemented in any suitable manner. For example, in some embodiments, BB amplifier 732 can be implemented using amplifiers as shown in FIG. 7. The BB amplifier may be formed from multiple pairs of amplifiers. As shown, the inputs to BB amplifier 732 connect to the non-ground side of the capacitors of the NPF.

Recombination circuit 734 can be implemented in any suitable manner. For example, recombination circuit 734 can be implemented using voltage to current converting $g_m$ cells as shown in FIG. 7. The recombination circuit may be formed from multiple pairs of $g_m$s to form I/Q outputs of the receiver.

Analog BB SIC 742 can be implemented in any suitable manner. For example, analog BB SIC 742 can be implemented as described above in connection with FIG. 6.

Amplifiers 744 and 746, mixer 748 and power amplifier 750 can be implemented in any suitable manner. For example, these components can be implemented as conventionally realized in a suitable transmitter.

Although FIG. 7 shows an example of a circulator-transceiver in accordance with some embodiments, many variations to this example are possible without departing from the spirit and scope of the present invention. For example, in some embodiments: BB SIC 742 can be omitted; and mixer 748 and power amplifier 750 can be on-chip.

Figure 8:
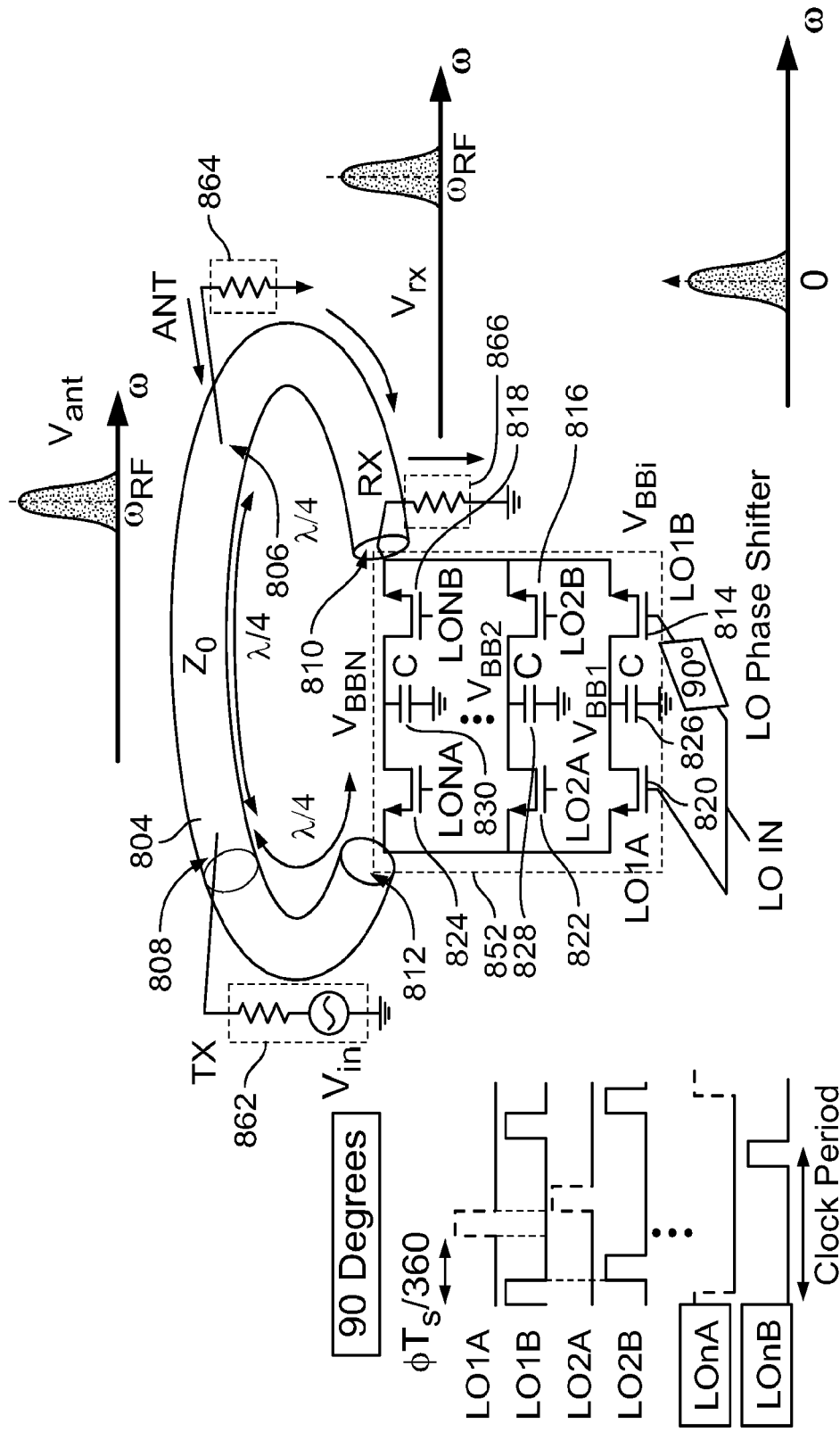
FIG. 8 is illustration of a non-reciprocal circulator formed from an N-path filter and ¾-wavelength-long ring that can be used with the transceiver of FIG. 7 in accordance with some embodiments.

Turning to FIG. 8, an illustration of the configuration of a 3λ/4-long ring section 804 and an N-path filter (NPF) 852 that can be used for ring section 704 (FIG. 7) and NPF 752 (FIG. 7), respectively, in accordance with some embodiments, is shown. As presented in FIG. 8, points 806, 808, 810, and 812 (which can represent points 706, 708, 710, and 712 (FIG. 7)) can be positioned along ring section 804 so that point 808 is λ/4 away from point 812, point 806 is λ/4 away from point 808, and point 810 is λ/4 away from point 806, where λ is the wavelength of the transmitted and received signal (e.g., λ is ~6 cm at 5 GHz).

In FIG. 8, box 862 represents the transmitter signal source and impedance, box 864 represents the antenna impedance, and box 866 represents the receiver impedance.

Within NPF 852, a first path is formed by transistors 814 and 820 and capacitor 826, a second path is formed by transistors 816 and 822 and capacitor 828, and an Nth path is formed by transistors 818 and 824 and capacitor 830. The gates of transistors 820, 814, 822, 816, 824, and 818 can be driven by local oscillator signals LO1A, LO1B, LO2A, LO2B, LOnA, and LOnB, respectively, as shown in the example timing diagram of FIG. 8. As illustrated, LO1B is shifted 90 degrees from LO1A, LO2B is shifted 90 degrees from LO2A, and LOnB is shifted 90 degrees from LOnA.

These local oscillator signals can have any suitable frequency, such as the operating frequency of the transceiver (e.g., 750 MHz).

Like transistors 714, 716, 718, 720, 722, and 724 of FIG. 7, transistors 814, 816, 818, 820, 822, and 824 of FIG. 8 are configured to act as switches, and maybe be referred to as switches and/or substituted with any component that can act as a switch in the circuit.

For incoming RF signals from an antenna (ANT) port at 806, not only can the RF signals be sensed on at point 810, but also the down-converted version of the received RF signals is present on the N-path filter capacitors. As a result, the N-path filter can be regarded as a mixer, and the rest of the receiver can be built to follow it, similar to mixer-first receivers.

Figure 9:
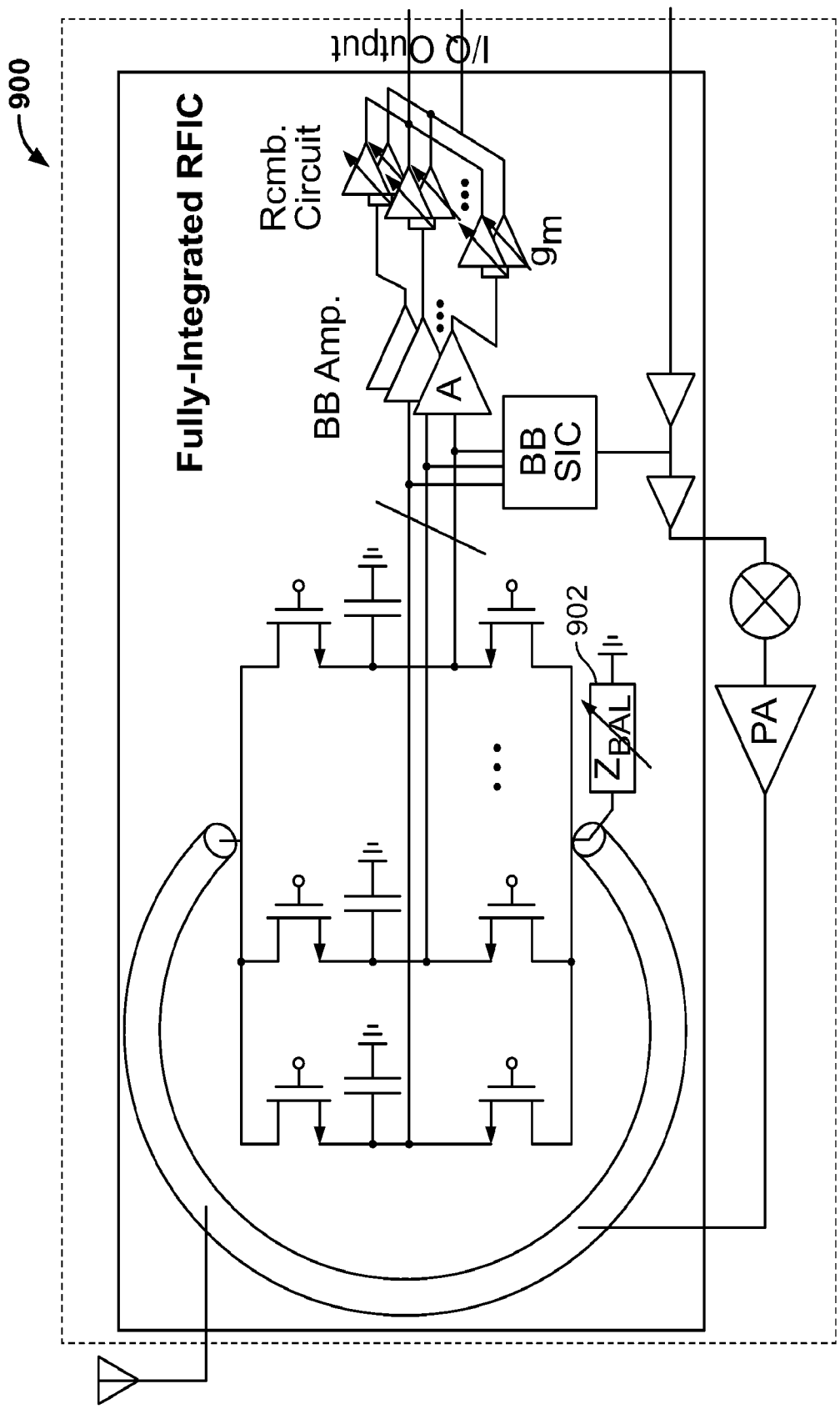
FIG. 9 is a schematic of still another transceiver using a non-reciprocal circulator in accordance with some embodiments.

Turning to FIG. 9, a variation 900 of a circulator-transceiver is shown in which the circulator-transceiver includes a programmable impedance 902 in accordance with some embodiments. Placing programmable impedance 902 at the transmitter (TX) side of the N-path filter can enhance isolation and can calibrate for antenna impedance mismatch without a major penalty to antenna-receiver loss and noise performance. In some embodiments, the value of programmable impedance 902 can be calculated using the following equation:

$$Z_{BAL} = \frac{Z_0 R_{sw} Z_{ant}}{R_{sw} Z_{ant} + Z_0 (Z_0 - Z_{ant})}$$

wherein:

$Z_{BAL}$ represents the value of programmable impedance 902;

$Z_{ant}$ represents the impedance of the antenna at a given point in time;

$R_{sw}$ represents the impedance of the switches formed by the NPF transistors; and $Z_0$ represents the characteristic impedance of the $3\lambda/4$-long ring section.

As can be seen from FIG. 9, in some embodiments, the termination resistor that is present in FIG. 7 (i.e., resistor 766) at the end of the ring section opposite from programmable impedance 902 can be omitted in some embodiments.

Figure 10A:
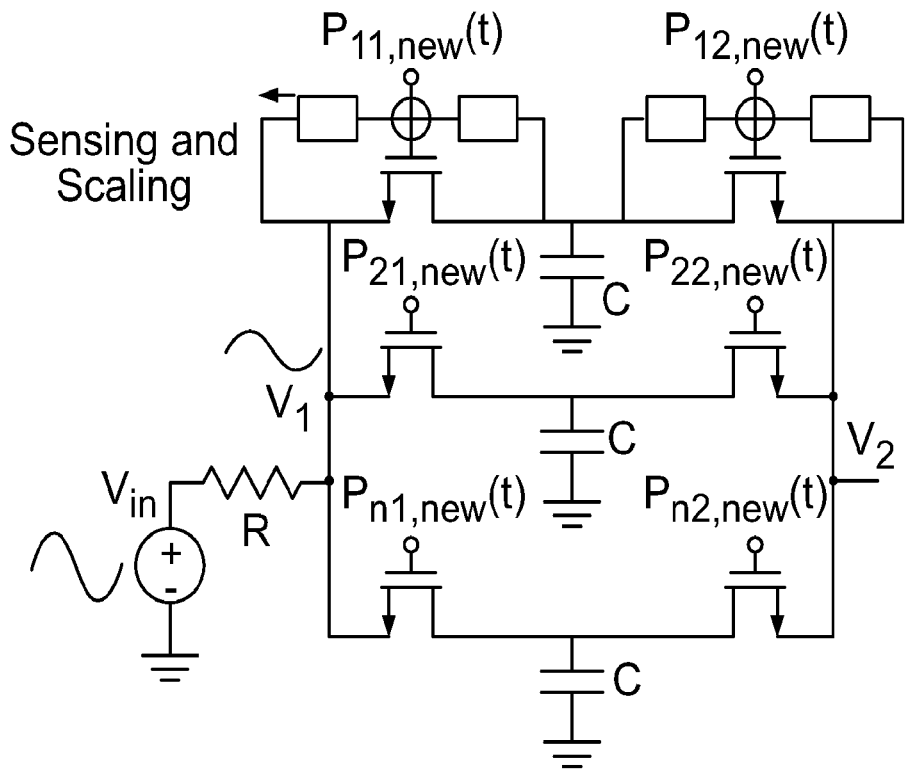
FIGS. 10A and 10B illustrate a technique for improving linearity in N-path filter switches in accordance with some embodiments.
Figure 10B:
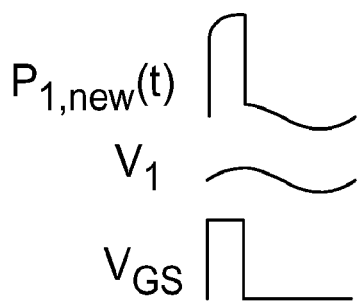

Turning to FIGS. 10A and 10B, a mechanism to improve the linearity of the switches in the NPFs in accordance with some embodiments is shown. As illustrated, switch linearization can be realized through coupling of source and drain signals to the switch gates. In any switched based circuit, when the voltage swing across the switch increases, the gate-source voltage of the switches changes and causes the switch resistance ($R_{on}$) to have a nonlinear profile. By sensing the voltages across each switch, scaling them, and adding them to the gate voltage, the $V_{gs}$ of the switch can be made more constant during the ON period and linearize $R_{on}$.

Figure 11:
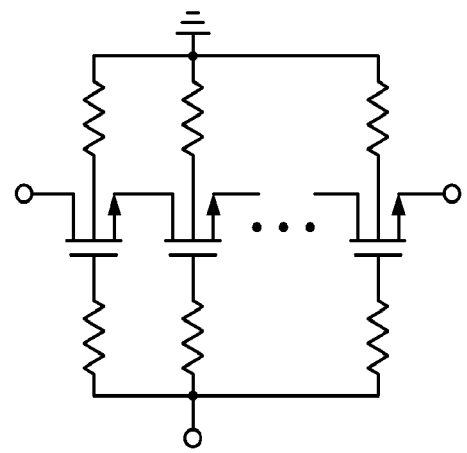
FIG. 11 illustrates another technique for improving linearity in N-path filter switches in accordance with some embodiments.

In some embodiments, additionally or alternatively, to improve the linearity of the switches in the NPFs, individual switches of the NPFs can be replaced with stacked switches as shown in FIG. 11. Device stacking in SOI CMOS technologies can increase power handling by 20 log N, where N is the number of stacked switches.

Figure 12A:
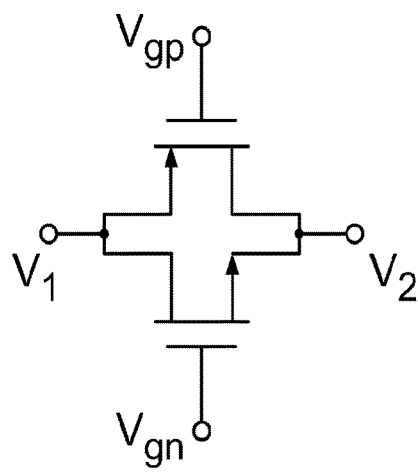
FIGS. 12A, 12B, and 12C illustrate still another technique for improving linearity in N-path filter switches in accordance with some embodiments.
Figure 12A:
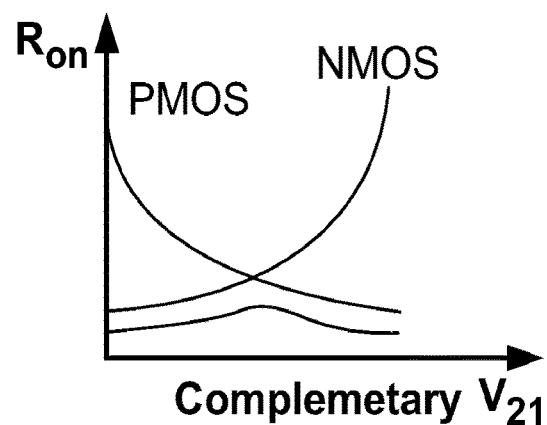
Figure 12B:
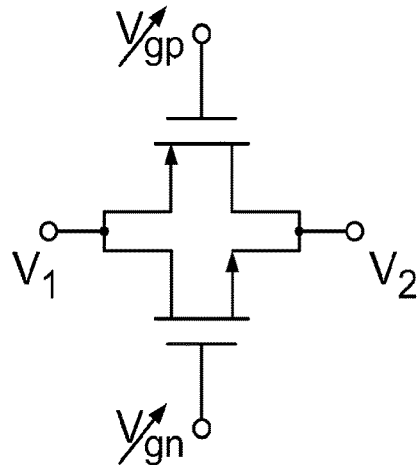
Figure 12B:
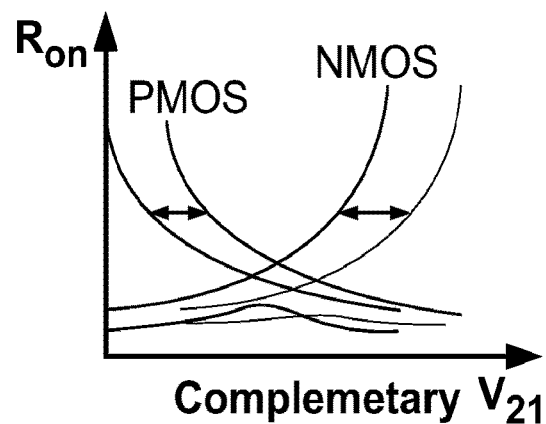
Figure 12C:
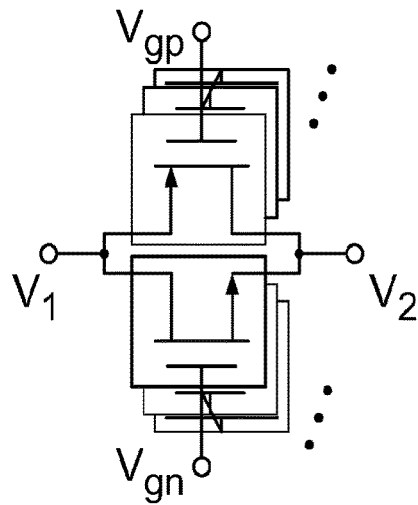
Figure 12C:
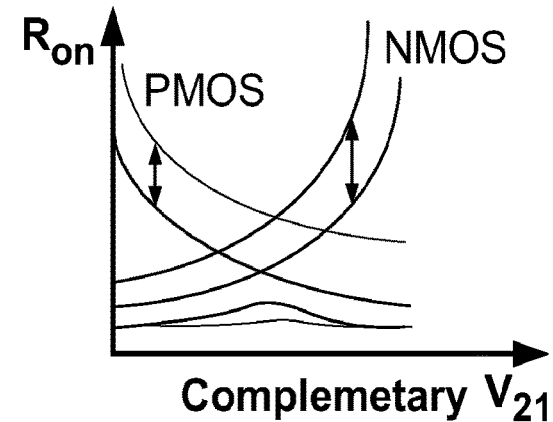

In some embodiments, additionally or alternatively, to improve the linearity of the switches in the NPFs, instead of using individual switches, complementary (e.g., NMOS and PMOS) switch pairs, such as shown in FIGS. 12A and 12B, can be used, and/or complementary (e.g., NMOS and PMOS) switch pair banks, such as shown in FIG. 12C, can be used. Complementary switch pairs and complementary switch pair banks may have a more linear $R_{on}$ profile compared to NMOS or PMOS switches due to distortion cancellation. For example, as shown in the right portion of FIG. 12A, the $R_{on}$ profiles for the PMOS and NMOS devices can combine to provide a flatter $R_{on}$ profile. As shown in FIG. 12B, the pairs can further be calibrated by changing the relative gate voltages of the NMOS and PMOS transistors, and/or by changing the relative size of each device. As shown in FIG. 12C, banks of parallel devices can be used to provide a set of relative sizes to further calibrate the combined Ron profile.

Figure 13:
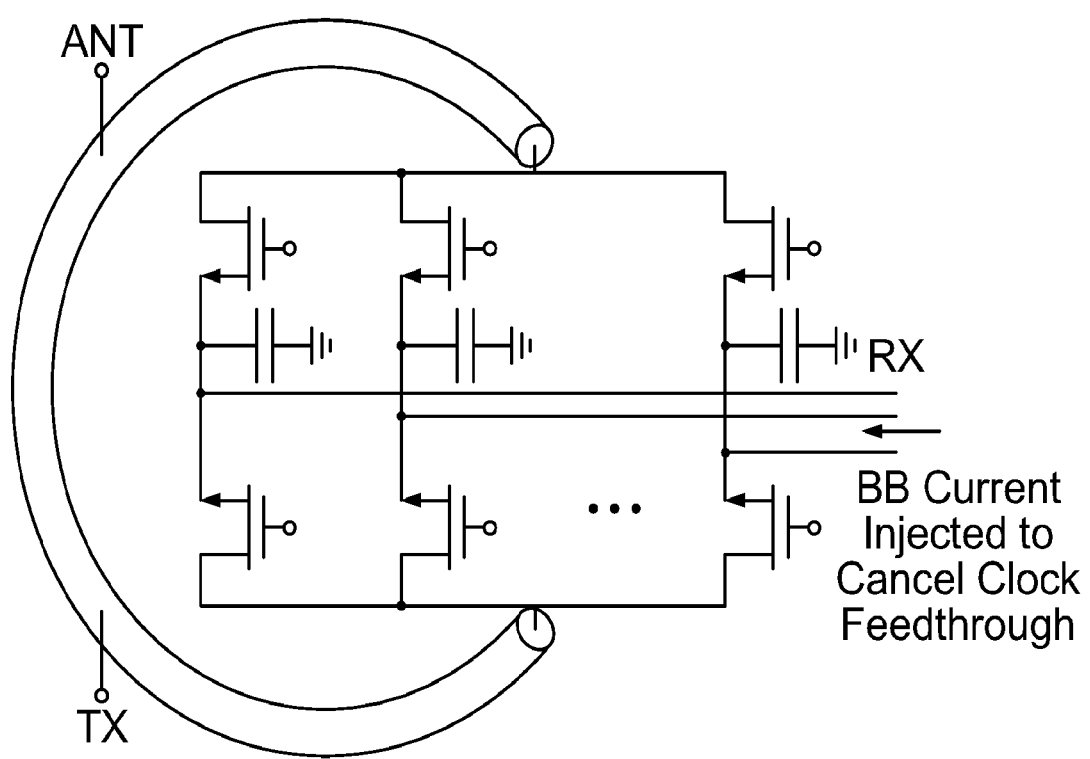
FIG. 13 illustrates a technique for cancelling clock feedthrough in a non-reciprocal circulator in accordance with some embodiments.

In some embodiments, in order to at least partially cancel clock feedthrough (e.g., coupling of the clock signal to the ANT port or TX port), a baseband current can be injected into one or more paths of the NPF as shown in FIG. 13. This baseband current can be generated in any suitable manner.

In some embodiments, circulators as described herein can also be configured to operate as a reciprocal transmit-receive switch for half-duplex time division duplex (TDD) applications.

Figure 14A:
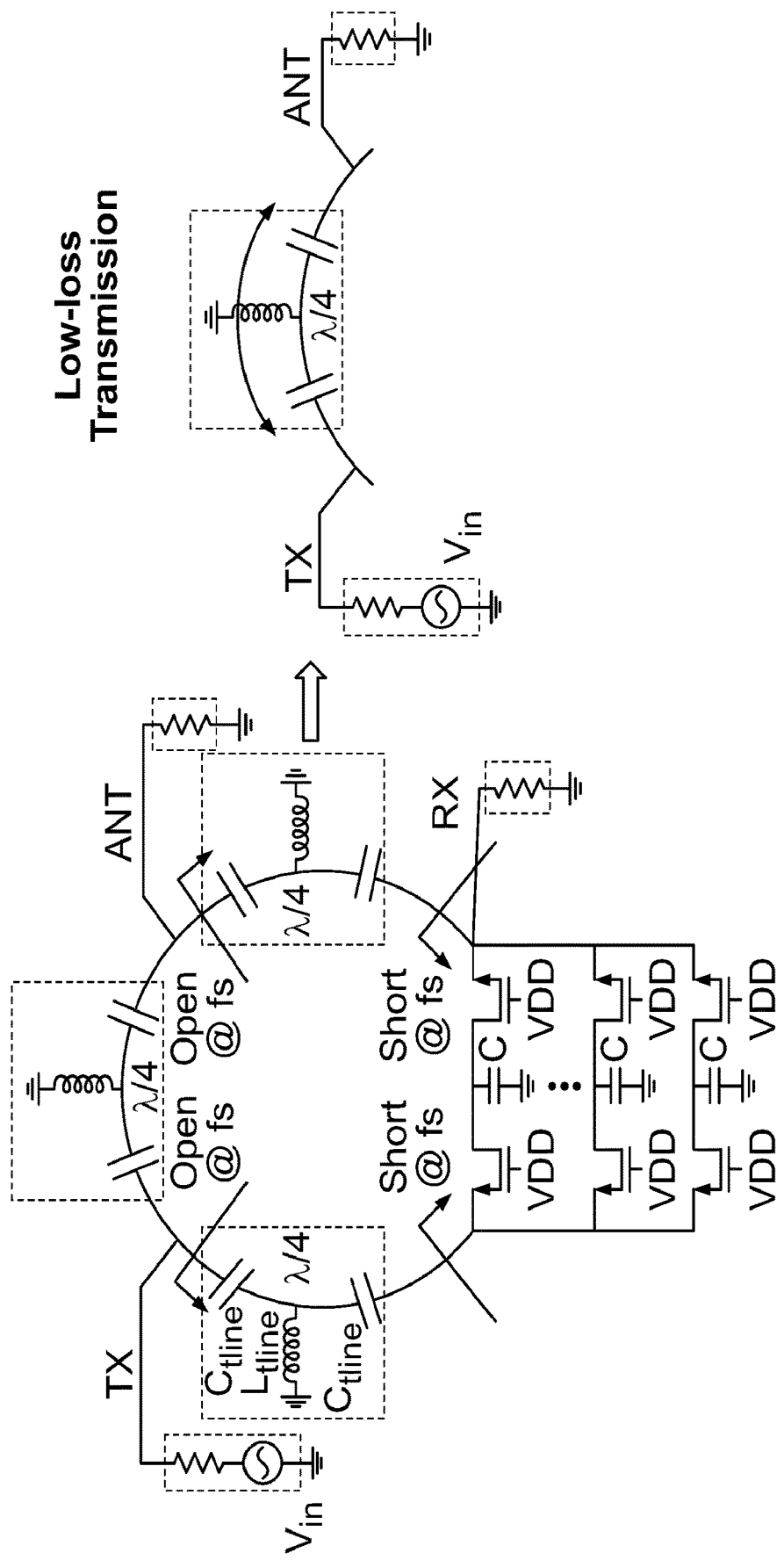
FIGS. 14A and 14B illustrate a technique for using a non-reciprocal circulator formed from an N-path filter and ¾-wavelength-long ring as a transmit-receive switch in accordance with some embodiments.

For example, in some embodiments, for TX-ANT transmission, the switches of at least one path can be turned ON continuously, creating a virtual ground at the RX port due to the large capacitance in parallel. This low impedance is transformed to relatively high impedances at the TX and ANT ports by the two quarter-wavelength ring sections on each side of the N-path filter. Hence, the circuit simplifies to a low loss 50 ohm transmission line between TX and ANT (FIG. 14A).

Figure 14B:
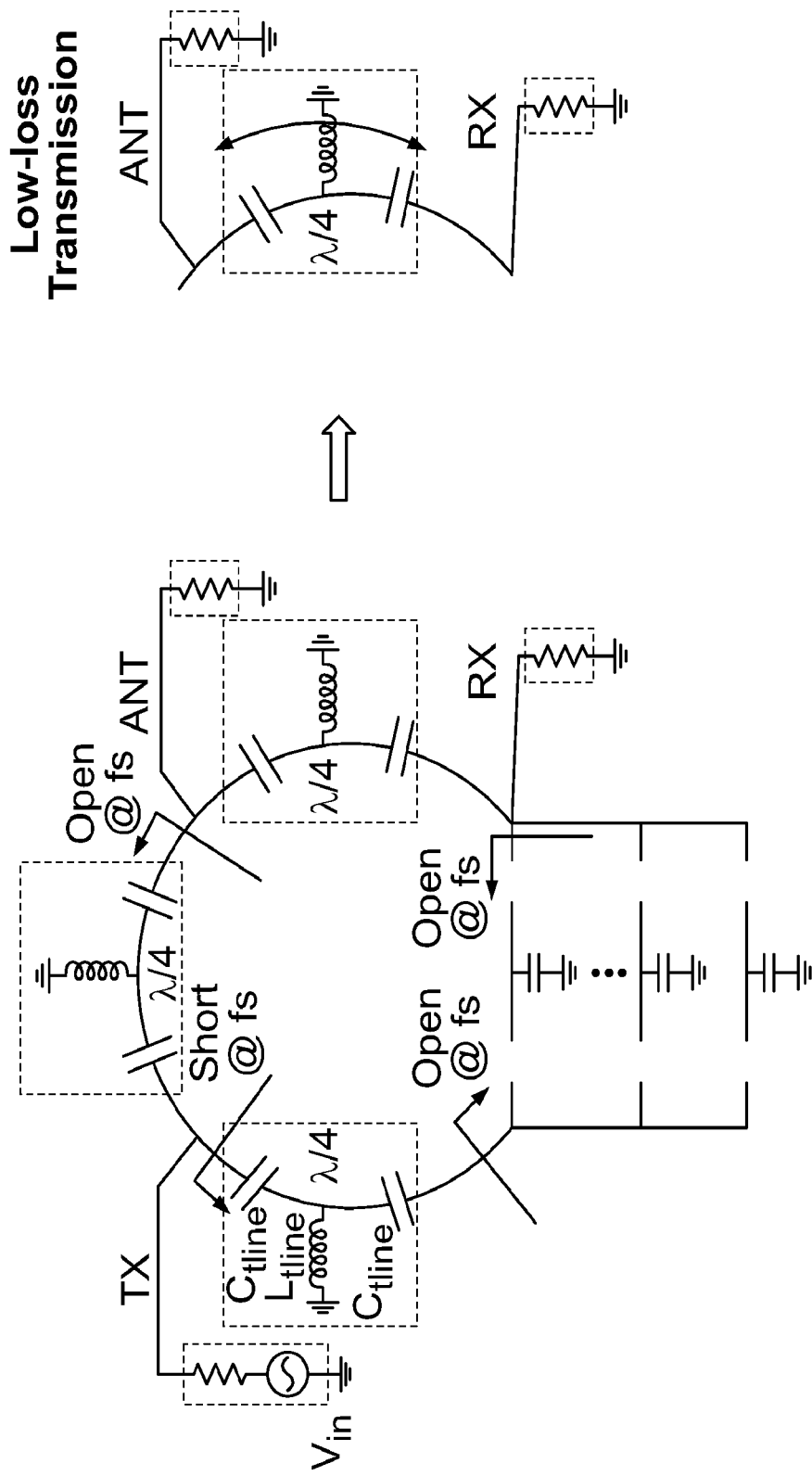

Similarly, if all the switches of the N-path filter are turned OFF, the high impedance at the N-path filter is transformed to a low impedance at the TX port, which in turn is transformed to a high impedance at the ANT port. The resulting equivalent circuit is a low loss 50 ohm transmission line between ANT and RX (FIG. 14B).

In some embodiments, the mechanisms described herein can be applied to other domains, such as the optical domain, where high-quality switches are available. Compact optical switches with one to two orders of magnitude ON/OFF transmission ratio enable optical non-reciprocity and isolation through commutation-based parametric modulation. The nanosecond scale switching speed of such switches implies GHz-range commutation frequencies, much smaller than the optical carrier frequency, which can be accommodated by commutating across high-Q optical filters that eliminate one of the modulation sidebands, similar to the RF commutation described herein.

Although the disclosed subject matter has been described and illustrated in the foregoing illustrative implementations, it is understood that the present disclosure has been made only by way of example, and that numerous changes in the details of implementation of the disclosed subject matter can be made without departing from the spirit and scope of the disclosed subject matter, which is limited only be the claims that follow. Features of the disclosed implementations can be combined and rearranged in various ways.

What is claimed is:

1. A non-reciprocal circulator comprising:
    a $3\lambda/4$-long ring section having a first end and a second end, wherein $\lambda$ is an operating wavelength of the non-reciprocal circulator; and
    a N-path filter having a first port, a second port, and N-paths, each of the N-paths being connected to the first port and the second port, wherein N is greater than one.

2. The non-reciprocal circulator of claim 1, wherein the $3\lambda/4$-long ring section includes a transmit port, an antenna port, and a receive port.

3. The non-reciprocal circulator of claim 2, wherein the transmit port is $\lambda/4$ away from the antenna port.

4. The non-reciprocal circulator of claim 3, wherein the antenna port is $\lambda/4$ away from the receive port.

5. The non-reciprocal circulator of claim 4, wherein the receive port is at the first port of the N-path filter.

6. The non-reciprocal circulator of claim 1, wherein the $3\lambda/4$-long ring section is formed from three lumped capacitor-inductor-capacitor (CLC) networks, each have a length of $\lambda/4$ and each having a first side and a second side, wherein: the first side of a first of the three CLC networks is connected to the first port of the N-path filter; the first side of a second of the three CLC networks is connected to the second side of the first of the three CLC networks; the first side of a third of the three CLC networks is connected to the second side of the second of the three CLC networks; and the second side of the third of the three CLC networks is connected to the second port of the N-path filter.

7. The non-reciprocal circulator of claim 6, wherein each of the three lumped CLC networks has:
a first capacitor having a first side connected to the first side of the CLC network and having a second side;
an inductor having a first side connected to the second side of the first capacitor and having a second side connected to ground; and
a second capacitor having a first side connected to the second side of the first capacitor and having a second side connected to the second side of the CLC network.

8. The non-reciprocal circulator of claim 1, wherein the $3\lambda/4$-long ring section is formed from three transmission lines, each with a length of $\lambda/4$.

9. The non-reciprocal circulator of claim 1, wherein the N-path filter has eight paths.

10. The non-reciprocal circulator of claim 1, wherein a first path of the N-path filter has: a first side and a second side; a first switch having a first side connected to the first side of the first path and having a second side; a capacitor having a first side connected to the second side of the first switch and having a second side connected to ground; and a second switch having a first side connected to the second side of the first switch and having a second side connected to the second side of the first path.

11. The non-reciprocal circulator of claim 10, wherein the first switch of the first path is a first transistor and the second switch of the first path is a second transistor.

12. The non-reciprocal circulator of claim 11, wherein the first switch of the first path is controlled by a first oscillator having a duty cycle of 1/N, wherein the second switch of the first path is controlled by a second oscillator having a duty cycle of 1/N, and wherein the first oscillator and the second oscillator are 90 degrees apart.

13. The non-reciprocal circulator of claim 12, wherein a second path of the N-path filter has: a first side and a second side; a first switch having a first side connected to the first side of the second path and having a second side; a capacitor having a first side connected to the second side of the first switch and having a second side connected to ground; and a second switch having a first side connected to the second side of the first switch and having a second side connected to the second side of the second path.

14. The non-reciprocal circulator of claim 13, wherein the first switch of the second path is a first transistor and the second switch of the second path is a second transistor.

15. The non-reciprocal circulator of claim 14, wherein the first switch of the second path is controlled by a third oscillator having a duty cycle of 1/N, wherein the second switch of the second path is controlled by a fourth oscillator having a duty cycle of 1/N, and wherein the third oscillator and the fourth oscillator are 90 degrees apart.

16. The non-reciprocal circulator of claim 15, wherein the third oscillator turns ON when the first oscillator turns OFF, and the fourth oscillator turns ON when the second oscillator turns OFF.

* * * * *